US007816929B2

(12) United States Patent
Yamada

(10) Patent No.: US 7,816,929 B2
(45) Date of Patent: Oct. 19, 2010

(54) SOCKET AND ELECTRONIC APPLIANCES USING SOCKET

(75) Inventor: Hiroshi Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/238,120

(22) Filed: Sep. 29, 2005

(65) Prior Publication Data
US 2007/0001692 A1 Jan. 4, 2007

(30) Foreign Application Priority Data
Jun. 30, 2005 (JP) ............................. 2005-192848

(51) Int. Cl.
*G01R 31/02* (2006.01)
(52) U.S. Cl. ...................................... 324/754; 324/760
(58) Field of Classification Search ................. 324/755, 324/760, 158.1
See application file for complete search history.

(56) References Cited

U.S. PATENT DOCUMENTS

| | | | | |
|---|---|---|---|---|
| 4,321,532 | A * | 3/1982 | Luna | 324/761 |
| 4,597,617 | A * | 7/1986 | Enochs | 439/66 |
| 5,086,269 | A * | 2/1992 | Nobi | 324/760 |
| 5,123,850 | A * | 6/1992 | Elder et al. | 439/67 |
| 5,325,052 | A * | 6/1994 | Yamashita | 324/754 |
| 5,734,270 | A * | 3/1998 | Buchanan | 324/754 |
| 5,923,179 | A * | 7/1999 | Taylor | 324/755 |
| 5,923,181 | A * | 7/1999 | Beilstein et al. | 324/758 |
| 6,046,597 | A * | 4/2000 | Barabi | 324/755 |
| 6,064,213 | A * | 5/2000 | Khandros et al. | 324/754 |
| 6,191,599 | B1 * | 2/2001 | Stevens | 324/760 |
| 6,392,431 | B1 * | 5/2002 | Jones | 324/760 |
| 6,597,190 | B2 * | 7/2003 | Chan et al. | 324/761 |

(Continued)

FOREIGN PATENT DOCUMENTS

JP      02-77891       6/1990

(Continued)

OTHER PUBLICATIONS

Japanese Office Action dated Mar. 9, 2010, 4 pages.

*Primary Examiner*—Ha Tran T Nguyen
*Assistant Examiner*—Arleen M Vazquez
(74) *Attorney, Agent, or Firm*—Arent Fox LLP

(57) ABSTRACT

The present invention is made with the aim of suppressing heat generation and thus reducing voltage drop, regarding a socket comprising probes to be connected to an electronic device such as an IC package. This is achieved by the socket 6 comprising heatsink components (heatsink plates 74, 76, 201, and 202) disposed adjacent to probes 32, 34, 36 so that the heatsink components move heat of the probes to a heat-sink area 84. The socket 6 includes an air layer AL encompassing at least heat-generating portions 104 and 106 in the probes. The heat-generating portions are extended to the side of the socket 6 and heatsink fins (heatsink slit 86) are formed at its end portion. The socket 6 comprises a first probe 32 to be connected with pressure between an electrode (electrode pad 26) of signal system in the electronic device (IC package 4) and an electrode (electrode pad 44) of a signal extraction board 38 corresponding to the signal system; and second probes 34 and 36 to be connected with pressure between electrodes (electrode pads 28 and 30) of power system in the electronic device and an electric conductor (conductive plates 40 and 42) corresponding to the power system.

20 Claims, 18 Drawing Sheets

U.S. PATENT DOCUMENTS

| | | | |
|---|---|---|---|
| 6,617,868 B1* | 9/2003 | Needham | 324/760 |
| 6,667,631 B2* | 12/2003 | Ivanov | 324/762 |
| 6,712,127 B2* | 3/2004 | Lee | 165/80.3 |
| 6,712,621 B2* | 3/2004 | Li et al. | 439/65 |
| 6,774,661 B1* | 8/2004 | Tustaniwskyj et al. | 324/765 |
| 6,919,734 B2* | 7/2005 | Saito et al. | 324/760 |
| 6,972,581 B2* | 12/2005 | Yamashita et al. | 324/760 |
| 7,199,598 B2* | 4/2007 | Ol | 324/760 |
| 2001/0013772 A1* | 8/2001 | Sugiyama et al. | 324/158.1 |
| 2004/0212383 A1 | 10/2004 | Yanagisawa et al. | |
| 2005/0253614 A1* | 11/2005 | Maruyama et al. | 324/760 |
| 2006/0022688 A1* | 2/2006 | Giga et al. | 324/754 |

FOREIGN PATENT DOCUMENTS

| | | |
|---|---|---|
| JP | 06180327 A * | 6/1994 |
| JP | 10-294582 A | 11/1998 |
| JP | 2000-208177 | 7/2000 |
| JP | 2000-241454 A | 9/2000 |
| JP | 2001-249155 | 9/2001 |
| JP | 2004-325305 | 11/2004 |

* cited by examiner

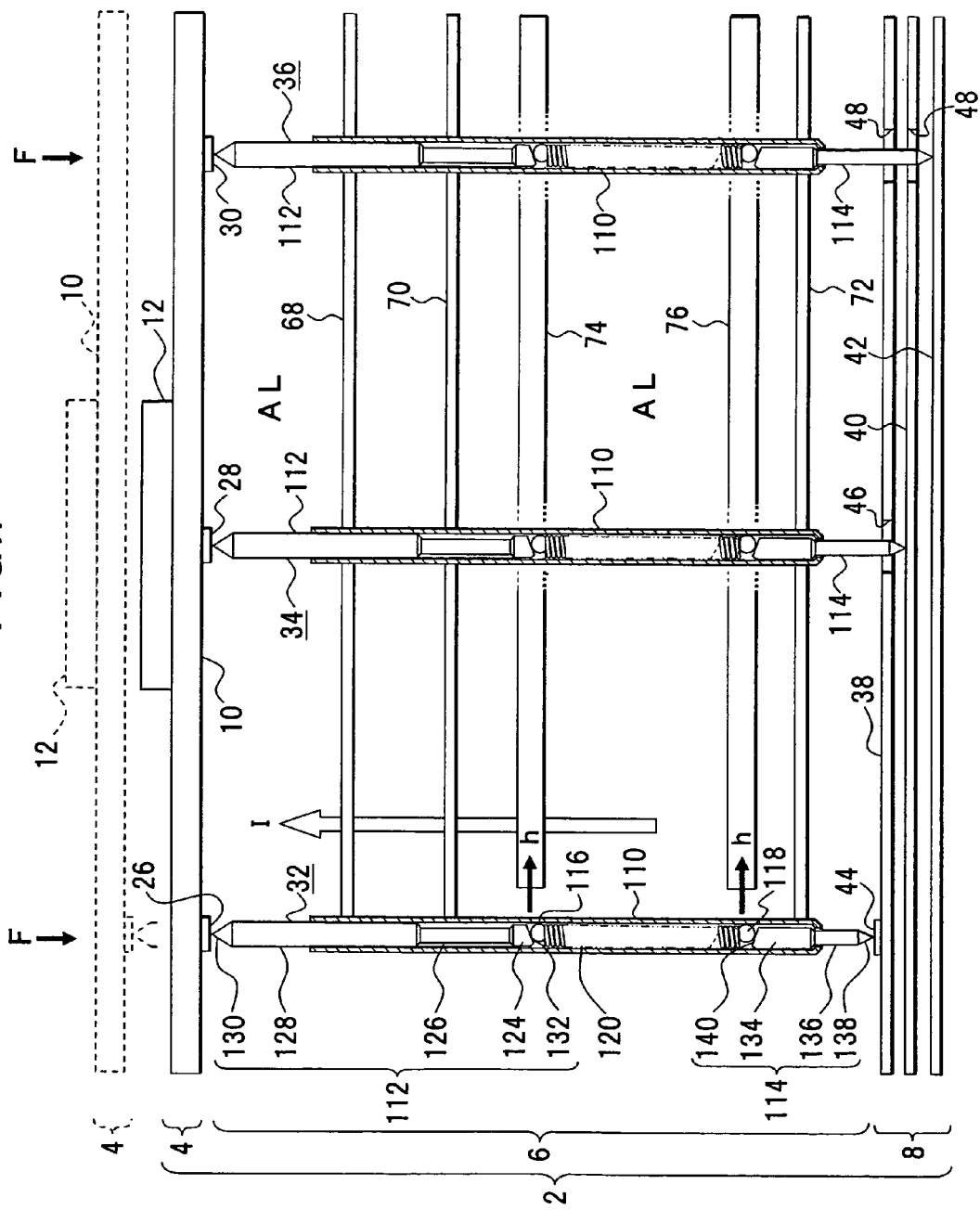

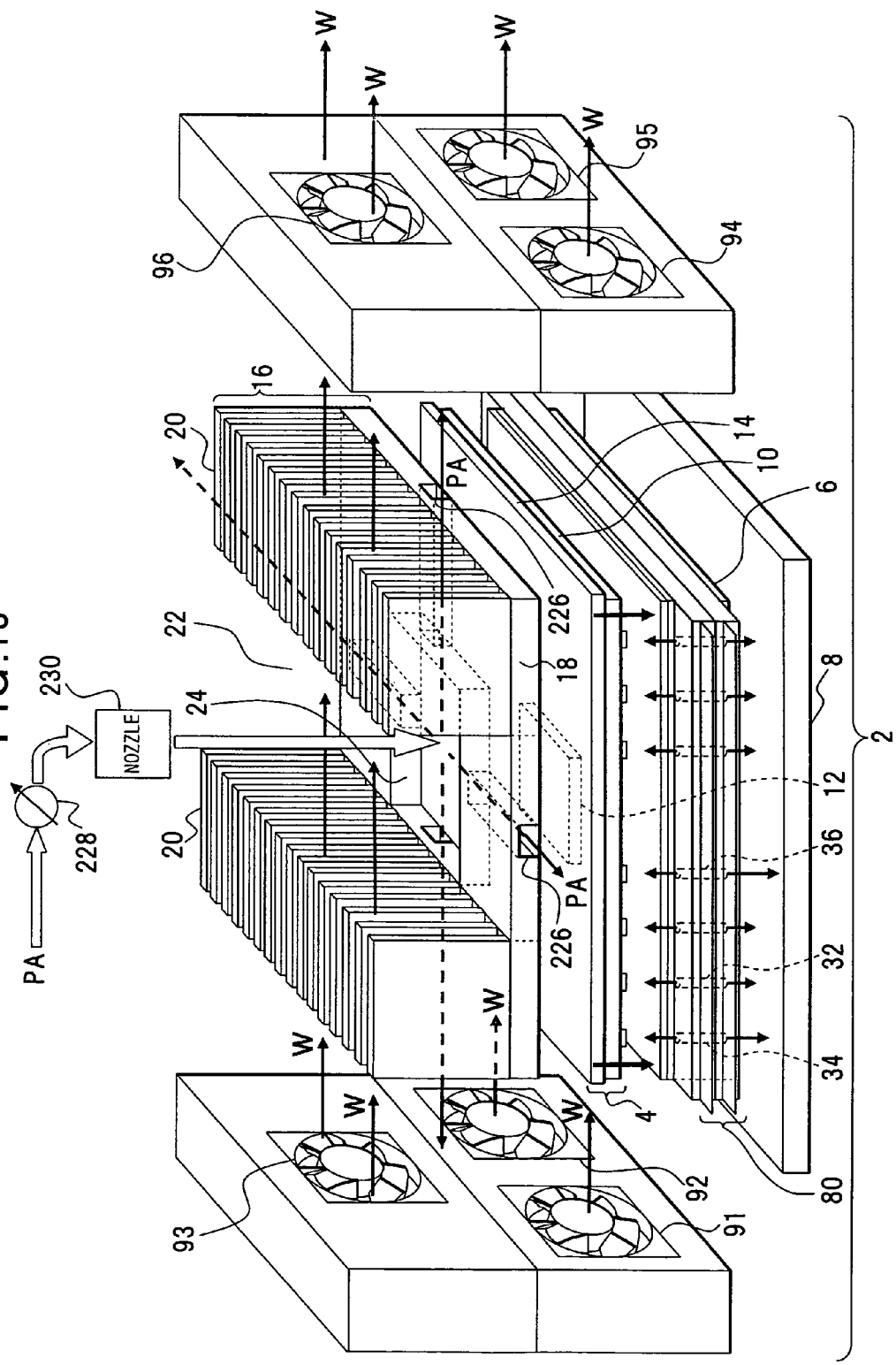

SOCKET AND ELECTRONIC APPLIANCES USING SOCKET

CROSS-REFERENCE RELATED APPLICATION

This application is based upon and claims the benefit of priority from the prior Japanese Patent Application No. 2005-192848, filed on Jun. 30, 2005, the entire contents of which are incorporated herein by reference.

BACKGROUND OF THE INVENTION

1. Field of the Invention

The present invention relates to a connection structure of an electronic device such as a multi-pin IC (Integrated Circuit) package, and specifically relates to a socket used for connecting to peripheral appliances or external circuits of the electronic device in order to extract signals or supply power and the like, and electronic appliances using such a socket.

2. Description of the Related Art

Conventionally, an IC package, as an example of electronic devices, has electrical power consumption of about 50 [W] at the maximum. And in order to connect such an IC package to external circuits, an IC socket equipped with a spring probe in a heat-resisting resin has been used. However, due to increased leak current in the IC package or due to the increased amount of current during operation brought by the speeding up of test frequency, when heat generation higher than 100 [W] is performed, heat generation in probes becomes an issue. Furthermore, with the widened data bus width, the ratio of signal pins tend to increase while the ratio of power pins (V/G) tend to decrease, which requires an IC socket that can support a large current.

By the way, a spring probe disposed in an IC socket includes, for example, a pair of plungers to bring into contact with the electrode pads, and has a tube structure to make electrical connection by providing a spring or the like between each of the plungers and by pressing the plungers to connect to the electrode pads. In the IC socket having such a structure, contact resistance comes with the structure and the contact resistance generates heat.

With regard to such heat generation in IC sockets, among conventional patent documents, there is one providing a heat sink in which a cooling fan is embedded in an IC socket (e.g., Japanese Patent Application Laid-Open Publication No. H10 (1998)-294582 (paragraph No. 0023, FIG. 1, etc.)); and one providing heat insulation and cooling structure of probes (e.g., Japanese Patent Application Laid-Open Publication No. 2000-241454 (paragraph No. 0030, FIG. 1, etc.)).

By the way, since a probe disposed between the electrode pads constitute a current path, contact portions (ohm contact) of plungers and a tube that supports the plungers in the probe are included in the current path, therefore resistance component in the contact portions causes heat generation. In such a structure that has a ball between the plunger and the spring, the contact portions of the ball and the plunger, and the contact portions of the ball and the tube constitute a part of the current path, so that the resistance component in these contact portions cause heat generation as well. Even though parts of the plunger, the tube, or the like are made of good conductive materials, when a current "i" flows through a contact resistance "r" existing in the contact portions, a heat "$i^2 r$" is generated. Because of this heat generation, restriction is placed on permissible current.

Further, with regard to relationship between the distance of the IC package and the spring probe, and internal resistance, although resistance is small in peripheral portions of the IC package because the distance from the spring probe is short; whereas resistance becomes large in the central portion side of the IC package because the distance from the spring probe is long. Therefore, when a large current flows by the power supply in the IC package, a potential difference arises between the central portions of the package and the spring probe contacting the peripheral portions of the package, which causes a voltage drop.

Therefore, it becomes necessary to secure permissible current as well as to reduce voltage drop in a current path in order to enable a large current flowing in a socket. And in order to secure permissible current, it is necessary to suppress high temperature by enhancing heatsinking of probes.

None of the above-described patent documents disclose nor suggest such issues at all, and there is no descriptions or suggestions about the solution.

SUMMARY OF THE INVENTION

The first object of the present invention is to suppress heat generation with regard to a socket comprising probes to be connected to an electronic device such as an IC package.

To be more specific, the first object is to secure maximum permissible current by improving heatsinking.

The second object of the present invention is to reduce voltage drop with regard to a socket comprising probes to be connected to an electronic device such as an IC package.

The third object of the present invention is to provide an electronic appliance using the above-described socket.

Each aspect of the configurations of the present invention in which the above-described issues have been solved will be listed and explained hereinafter.

To attain the first object, according to a first aspect of the present invention there is provided a socket having a probe to be connected to an electronic device, comprising a heatsink component disposed adjacent to the probe in order to move heat in the probe to a heatsink area.

According to this configuration, since the heat in the probe can be moved to the heatsink area through the heatsink component, and with this heat movement, the probe is cooled down by dispersing the heat, which reduces resistance in the probe, and eventually heat generation can be suppressed and maximum current capacity of permissible current can be secured as well.

To attain the above-described first object, the socket may further comprise an air layer encompassing at least heat-generating portions in the probe. According to this configuration, the heat in the probe is dispersed into air in the air layer and a local overheating in the probe can be prevented. That is, heat density can be lowered. Therefore, current capacity of permissible current can be enhanced as well with this configuration.

To attain the above-described first object, in the socket, the heatsink component may be extended to the side of the socket such that its end portion forms heatsink fins. According to this configuration, heat movement can be enhanced by heatsinking of the heatsink fins and the probe can be cooled down, which reduces resistance in the probe, and eventually heat generation can be suppressed. Therefore, current capacity of permissible current can be enhanced also with this configuration.

To attain the above-described second object, according to a second aspect of the present invention there is provided the socket, further comprising a first probe to be connected with pressure between an electrode of signal system in the electronic device and an electrode of signal extraction board corresponding to the signal system; and a second probe to be connected with pressure between an electrode of power system in the electronic device and an electric conductor corresponding to the power system.

According to this configuration, since the signal system and the power system consist of separate probes, connection distance of the power system can be shortened and direct current resistance in the current path can be reduced, which reduces the potential difference and voltage drop. Therefore, current-carrying capacity of permissible current can be enhanced also with this configuration.

To attain the above-described third object, according to a third aspect of the present invention there is provided an electronic appliance having a socket to be connected to an electronic device, comprising a signal extraction board corresponding to signal system in the electronic device; a first probe disposed in the socket and connected with pressure between an electrode of signal system in the electronic device and an electrode of the signal extraction board; and a second probe disposed in the socket and connected with pressure between an electrode of power system in the electronic device and an electric conductor corresponding to the power system.

According to this configuration, since the signal system and the power system consist of separate probes, especially connection distance of the power system can be shortened and direct current resistance in the current path can be reduced, which reduces the potential difference and voltage drop. Therefore, current capacity of permissible current can be enhanced, making it suitable to be used for a test or an electronic appliance using a large amount of current.

To attain the above-described objects, in the socket, the heatsink area may be cooled down by air or water; the electronic device may be an IC package; the probe may be comprised of a tube and a plunger supported by the tube; a space part formed in a holding component that holds the probe such that the space part constitutes an air layer may be further provided; and the heatsink component may further comprise a space part such that the space part constitutes an air layer.

To attain the above-described objects, in the electronic appliance, an air fan to supply cooling air to the sidewall of the socket may further be provided; the revolutions per minute of the air fan may be controlled by using a temperature detected by a temperature sensor mounted on an IC package as a control information; and any one of the previously described sockets may be provided.

Features and advantages of the present invention will be listed hereinbelow.

(1) According to the present invention, heatsinking of a probe can be enhanced and heat generation in the probe can be suppressed as well, thereby current-carrying capacity of permissible current can be enhanced.

(2) According to the present invention, by providing an air layer, heat density of a probe can be lowered so that heat generation in the probe can be suppressed, and eventually current-carrying capacity of permissible current can be enhanced.

(3) According to the present invention, by providing a first probe in the signal extraction board corresponding to the signal system in the electronic device and by providing a second probe in the electric conductor corresponding to the power system, connection distance of each system can be further shortened, which reduces the potential difference and eventually voltage drop, leading to the enhancement of current-carrying capacity of permissible current.

An electronic appliance of the present invention makes it suitable to be used for a test or an electronic appliance using a large amount of current with its increased permissible current.

The above and other objects, features and advantages of the present invention will become more apparent from the following detailed description when taken in conjunction with the accompanying drawings.

BRIEF DESCRIPTION OF THE DRAWINGS

FIG. 7 is a diagram showing a compression connection structure of probes;

FIG. 18 is a diagram showing a socket and an electronic appliance according to other embodiments.

DETAILED DESCRIPTION OF THE PREFERRED EMBODIMENTS

First Embodiment

Figure 1:
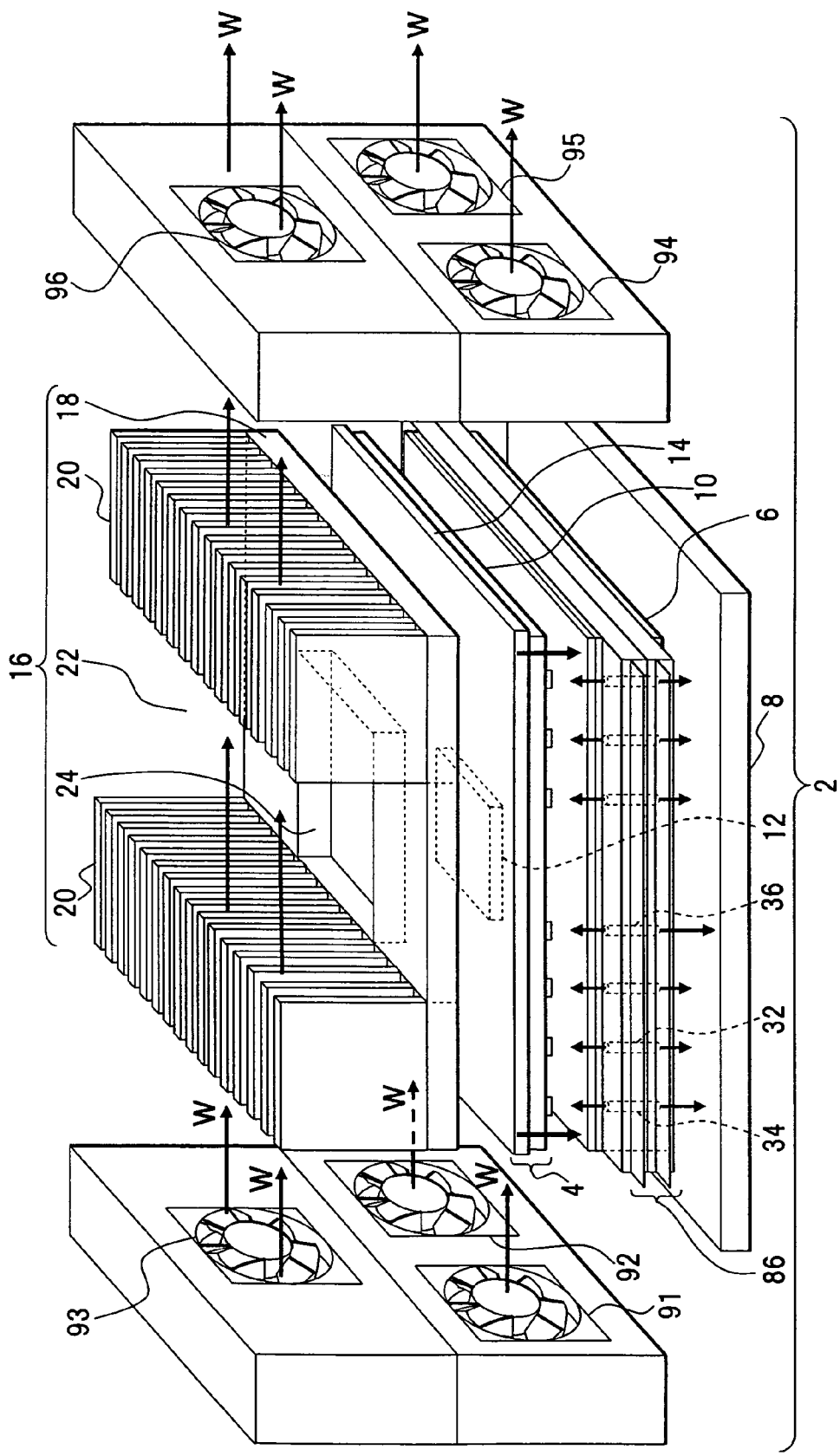
FIG. 1 is a diagram showing a socket and an electronic appliance according to a first embodiment.
Figure 2:
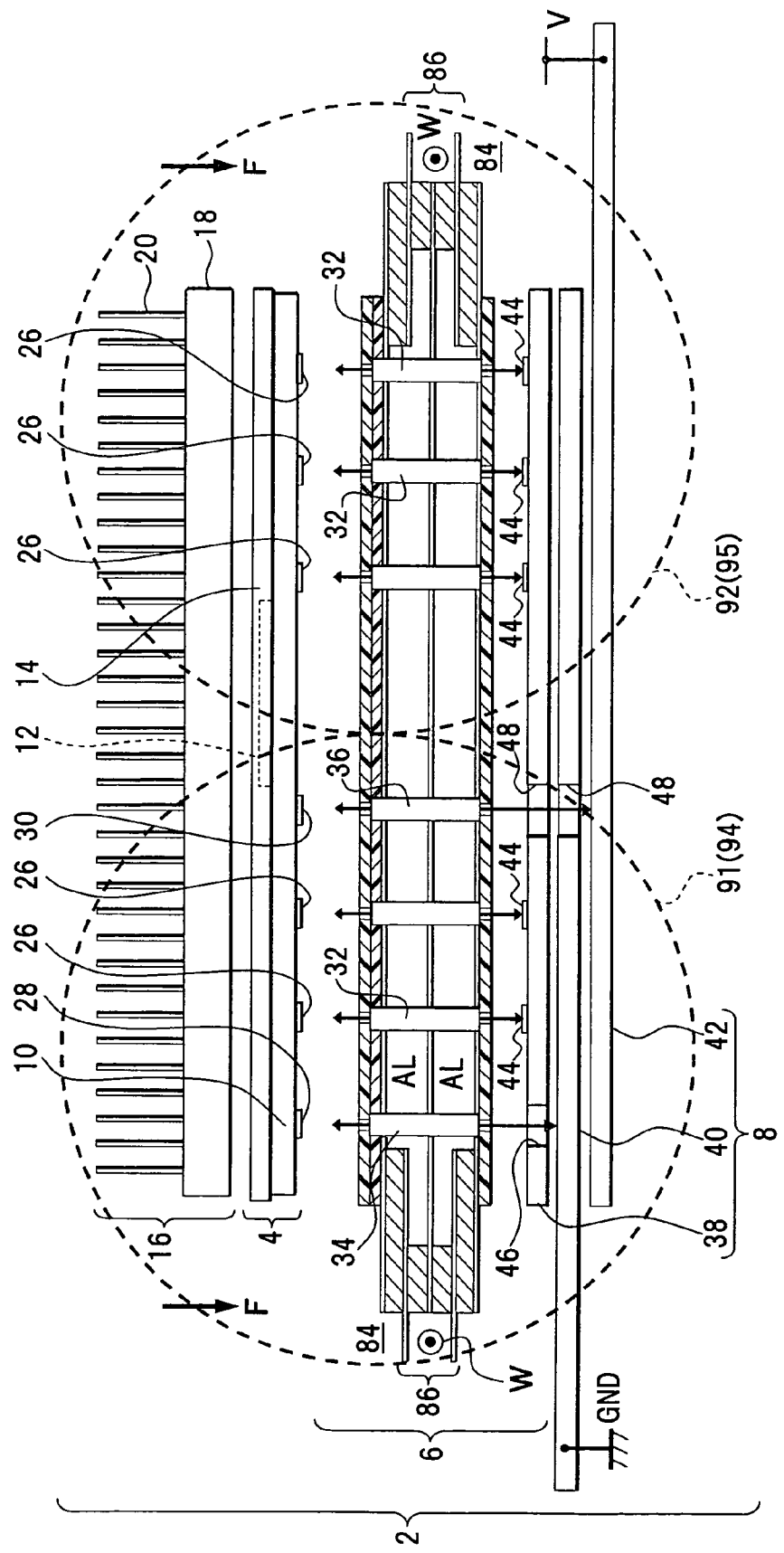
FIG. 2 is a diagram showing connection structure of a socket and an IC package.

A first embodiment of the present invention will be described with reference to FIGS. 1 and 2. FIG. 1 is a diagram showing a socket and an electronic appliance according to a first embodiment, and FIG. 2 is a diagram showing connection structure of a socket and an IC package. In FIGS. 1 and 2, the same symbols are assigned to identical parts.

This electronic appliance 2 is connected to an IC having multi-pin structure, an electronic device such as an IC package, a peripheral appliance, and an external circuit. In this embodiment, an IC package 4 is used as one example of the electronic device, i.e., a connection target. This electronic appliance 2 includes the IC package 4, a socket 6 and a socket board 8 as well as a plurality of air fans 91, 92, 93, 94, 95, 96 for supplying a cooling air W to the IC package 4 and the socket 6. Although a LGA (Land Grid Array) is exemplified as the IC package 4, connection structure according to this electronic appliance 2 can be also applied to a BGA (Ball Grid Array). Further, the air fans 91, 92, 93, 94, 95, 96 for cooling down are one example, and without being limited to these fans, other cooling devices such as water cooling can be used as well.

In the IC package 4, an IC chip 12 having such as a semiconductor element in a multilayer wiring circuit substrate 10 is mounted and also a covering board 14 made of metallic materials is so disposed as to surround the IC chip 12. On the upper surface of the covering board 14, a heatsink 16 is disposed as a heatsink component. For this heatsink 16, a heat charge plate 18 is used, and on this heat charge plate 18, a plurality of fins 20 is formed in order to improve a cooling effect by increasing contacting area with the cooling air W. In this embodiment, a ditch 22 is formed between the fins 20 aligned in two rows; and the IC chip 12 is exposed from an opening portion 24 formed in this ditch 22. Further, on the back of the substrate 10, as shown in FIG. 2, a plurality of electrode pads 26 connected to signal pins of the IC chip 12, and electrode pads 28 and 30 connected to power pins of the IC chip 12 are disposed. In this case, since the power pins include both sides (voltage (V) side and ground (GND) side), the electrode pad 28 is the ground side and the electrode pad, 30 is the voltage side.

The socket 6 includes a first probe 32 corresponding to the signal system as plural probes and second probes 34 and 36 corresponding to the power system. Here, the term "signal system" is used to separate from power system circuits, and the power system includes a grounding circuit other than a feeding circuit from the power source. Accordingly, the probes 32 correspond to the electrode pads 26 of the signal system, whereas the probes 34 and 36 correspond to the electrode pads 28 and 30 of the power system respectively.

The socket board 8 facing the IC package 4, interposing such a socket 6 therein includes a signal extraction board 38 as a conductor of the signal system and conductive plates 40 and 42 as a conductor of the power system other than the signal system. These signal extraction board 38 and conductive plates 40 and 42 are stacked in layers to form a multilayer structure. The signal extraction board 38 is a circuit board that corresponds to the signal system except for the power system and that constitutes a signal system circuit. Each of the conductive plates 40 and 42 is made of conductive materials such as a copper plate having good conductivity and constitutes a power system circuit including the grounding circuit.

On the signal extraction board 38, electrode pads 44 are disposed at the position opposing each of the electrode pads 26 on the substrate 10; and through holes 46 and 48 are formed at the position opposing the electrode pads 28 and 30 of the power system. That is, the electrode pads 26 of the signal system on the substrate 10 and the electrode pads 44 on the signal extraction board 38 are set to be situated each at the same position interposing the socket 6 between; and the electrode pads 28 and 30 of the power system and the through holes 46 and 48 on the signal extraction board 38 are set to be situated each at the same position.

The conductive plate 40 is exposed from the through hole 46 situated in the position opposing the electrode pad 28 on the substrate 10. Further, in this conductive plate 40, the through hole 48 is formed at the same position as the electrode pad 30. The conductive plate 42 is exposed from the through hole 48 situated in the position opposing the electrode pad 30 on the substrate 10.

According to such an electronic appliance 2, since the IC package 4 and the socket 6 are connected to each other with pressure to be held on the socket board 8, as indicated by arrows F in FIG. 2, the probes 32 constitute the signal path by being connected with pressure between the electrode pads 26 on the substrate 10 and the electrode pads 44 on the signal extraction board 38; while the probe 34 constitutes the power system circuit (grounding path) by being connected with pressure between the electrode pad 28 on the substrate 10 and the conductive plate 40; whereas the probe 36 constitutes the power system path by being connected with pressure between the electrode pad 30 on the substrate 10 and the conductive plate 42.

In this case, since the probe 34 is set to become longer than the probes 32, the probe 34 is connected to the conductive plate 40 with pressure by penetrating the through hole 46 in the signal extraction board 38; and since the probe 36 is set to become longer than the probe 34, the probe 36 is connected to the conductive plate 42 with pressure by penetrating the through hole 48 in the signal extraction board 38 and the through hole 48 in the conductive plate 40. Therefore, the substrate 10 on which the IC package 4 is mounted is connected to the socket board 8 interposing the socket 6; and via this socket board 8, connection is made to peripheral appliances or external circuits.

Figure 3:
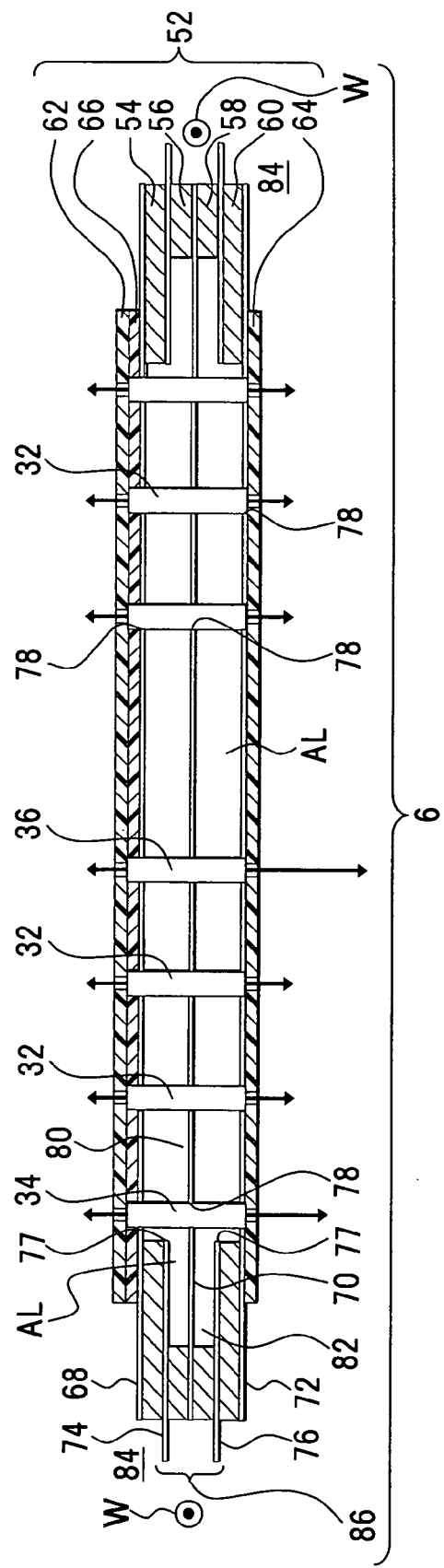
FIG. 3 is a cross-sectional view of a socket.

Next, structure of the socket 6 will be described with reference to FIG. 3. FIG. 3 is a diagram of the socket 6 excerpted from FIG. 1. In FIG. 3, the same symbols are assigned to parts identical to those in FIGS. 1 and 2.

This socket 6 includes a frame-like socket casing 52 as a probe holder for holding the plural probes 32, and the probes 34, 36. This socket casing 52 includes a plurality of holding frames 54, 56, 58, 60 that are made of metal or resin, and probe pin detachment prevention plates 62, 64 are disposed each on the upper and lower sides as the probe holder. And a guide plate 66 is disposed underneath the probe pin detachment prevention plate 62.

A plurality of probe alignment plates 68, 70, 72 sandwiches the holding frames 54, 56, 58, 60 in layers together with heatsink plates 74, 76 stacked therein as plural heatsink component. In this case, the probe alignment plates 68, 70, 72 are interposed by the holding frames 54, 56, 58, 60 and the heatsink plates 74, 76; and these constitute a distance holding component. In the probe alignment plates 68, 70, 72, through holes 78 are formed at the position corresponding to where the plural probes 32, and the probes 34, 36 are disposed; and with these through holes 78, the plural probes 32, and the probes 34, 36 are aligned at each fixed position. The heatsink plates 74, 76 are made of, for example, materials having good heat conductivity such as aluminum alloy plate, and each of the probes 32, 34, 36 are connected to through holes 77 formed in the heatsink plates 74, 76.

Further, in the holding frames 54, 56, 58, 60, a plurality of air spaces 80, 82 are formed as an air space encompassing peripheral portions of each probe 32, 34, 36. Each air space 80, 82 forms the air layer AL encompassing heat-generating portions of each probe 32, 34, 36. In this embodiment, the air spaces 80, 82 are formed by the disposition of the probe alignment plate 70 separating top and bottom of the socket 6; however, the air spaces may be formed as a single air space by making a through hole in the probe alignment plate 70 so that the air spaces 80, 82 communicate with each other.

Each of the heatsink plates 74, 76 faces the air layer AL formed by the above-described air spaces 80, 82, and also its end portion is disposed adjacent to the heat-generating portions of the probes 32, 34, 36 such that the heat from these heat-generating portions can be conveyed to each of the heatsink plates 74, 76.

Further, the peripheral portions of each of the heatsink plates 74, 76 are extended to a heatsink area 84 provided at the sidewall of the socket casing 52, and a heatsink slit 86 is formed thereat as a heatsink fin. To the heatsink area 84, the cooling air W is supplied from the air fans 91 to 96, and with this cooling air W flowing to the heatsink slit 86, the heatsink plates 74, 76 are cooled down.

Figure 4:
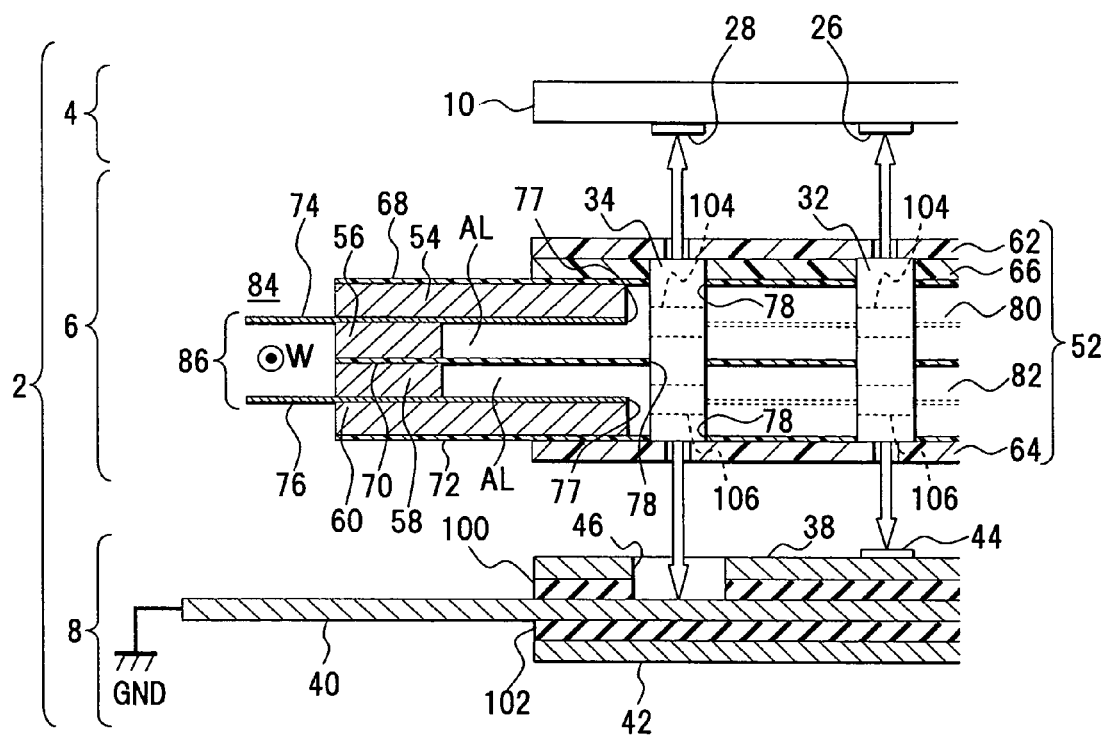
FIG. 4 is a diagram showing connection structure of a socket by probes.
Figure 5:
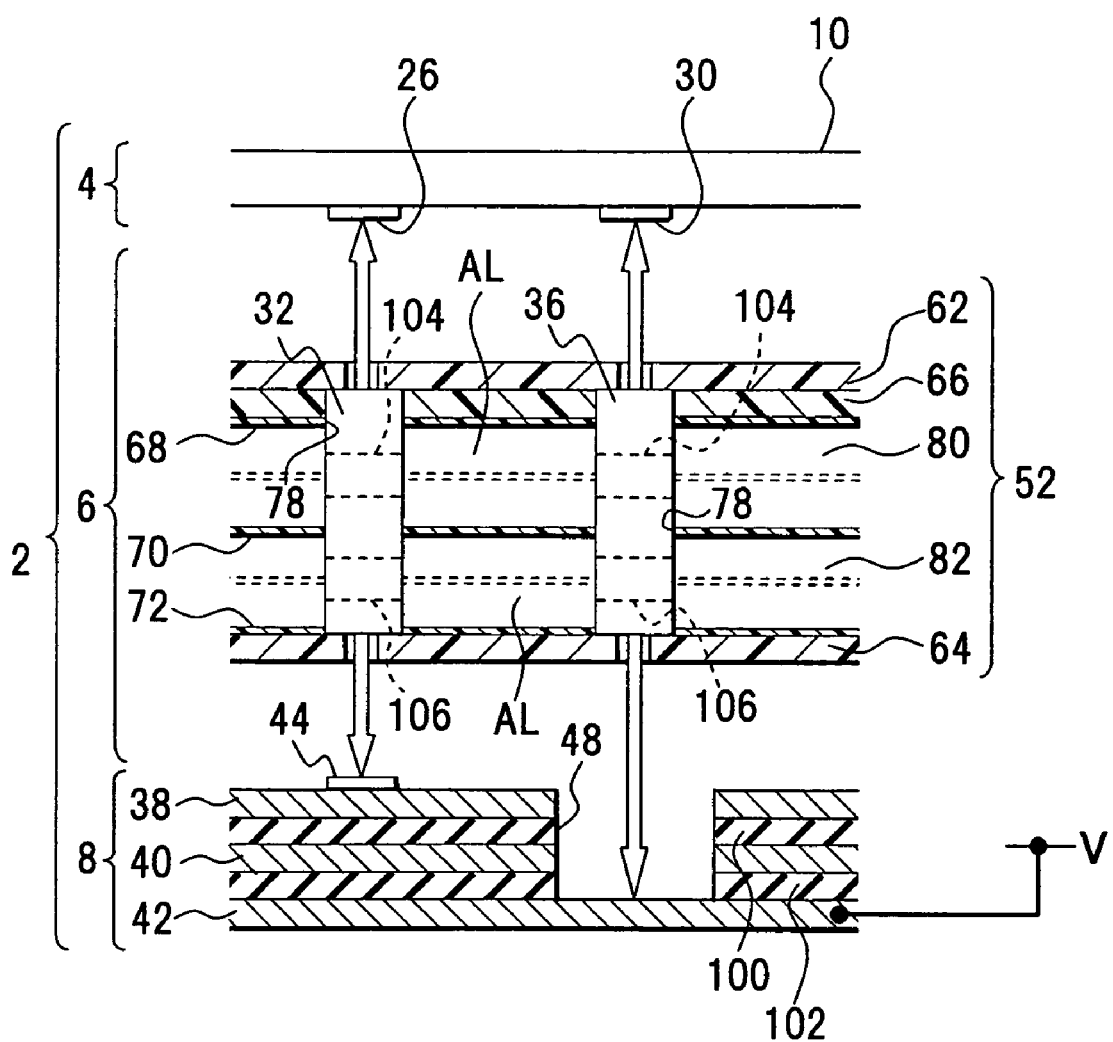
FIG. 5 is a diagram showing connection structure of a socket by probes.

Next, connection of the socket 6 by each of the probes 32, 34, 36 will be described with reference to FIGS. 4 and 5. FIGS. 4 and 5 are diagrams showing each of the probes in the socket and its connection structure. In FIGS. 4 and 5, the same symbols are assigned to parts identical to those in FIGS. 1, 2, and 3.

As shown in FIG. 4, the socket board 8 constitutes a single laminated board by laminating an insulating board 100 between the signal extraction board 38 and the conductive plate 40, and by laminating an insulating board 102 between the conductive plate 40 and the conductive plate 42; and achieves electrical insulation between the boards. A through hole 46 is formed in the insulating board 100 in order to expose the conductive plate 40. In this case, each of the probes 32 in the socket 6 is connected with pressure between the electrode pad 26 on the substrate 10 and the electrode pad 44 on the signal extraction board 38 of the socket board 8; and each of the probes 34 in the socket 6 is connected with pressure between the electrode pad 28 on the substrate 10 and the conductive plate 40 of the socket board 8. Further, as shown in FIG. 5, each of the probes 36 in the socket 6 is connected with pressure between the electrode pad 30 on the substrate 10 and the conductive plate 42 of the socket board 8. In this case, a through hole 48 is formed in the insulating boards 100, 102 in order to expose the conductive plate 42. Therefore, a signal extraction system circuit is constructed between the IC package 4 and the signal extraction board 38 via each of the probes 32; a power system circuit (grounding circuit) is constructed between the IC package 4 and the conductive plate 40 via each of the probes 34; and a power system circuit is constructed between the IC package 4 and the conductive plate 42 via each of the probes 36.

In such configurations, each of the probes 32, 34, 36 is aligned by penetrating the through holes 78 in probe alignment plates 68, 70, 72, and passes through the air layer AL in the above-described air spaces 80, 82. In the middle portions of each of the probes 32, 34, 35, heat-generating portions 104, 106 are produced by passing current, and the heat in these heat-generating portions 104, 106 is dispersed into the air layer AL by the air. As a result, temperature of the air in the air layer AL is raised while heat density is reduced in proportion to the heat dispersion from the heat-generating portions 104, 106. That is, heatsinking and cooling down of the heat-generating portions 104, 106 are achieved and as a result of reduced resistance in the probes, loss of the permissible current in the electronic appliance 2 having such connection structure can be reduced and its maximum current capacity can be secured.

Further, the heatsink plates 74, 76 are disposed at the position to meet the height of each of the heat-generating portions 104, 106. That is, an edge of the heatsink plate 74 is disposed adjacent to the heat-generating portion 104, and an edge of the heatsink plate 76 is disposed adjacent to the heat-generating portion 106. Further, a part of each of the heatsink plates 74, 76 is exposed in the air layer AL. The heat of the heat-generating portions 104, 106 is absorbed by the corresponding heatsink plates 74, 76, and moves to the heatsink area 84 side. In that case, the heatsink plates 74, 76 also absorb the heat in the air layer AL and move the heat to the heatsink area 84 side. This heat movement is all the more enhanced by the heatsinking with the cooling air W at the heatsink slit 86 side. The air temperature in the air layer AL is lowered as well as the heat in the heat-generating portions 104, 106 is moved to the heatsink area 84. Therefore, heatsinking and cooling down of the air layer AL and the heat-generating portions 104, 106 can be achieved, and with this, the resistance in the probes can be reduced as described above, so that the heat generation can be suppressed and the loss of permissible current in the electronic appliance 2 can be reduced, and eventually maximum current capacity can be secured.

Further, the electrode pad 28 of the power system in the IC package 4 is connected to the conductive plate 40 located directly underneath the electrode pad 28 by the probe 34 penetrating the signal extraction board 38; and the electrode pad 30 is connected to the conductive plate 42 located directly underneath the electrode pad 30 by the probe 36 penetrating the signal extraction board 38. That is, with the conductive plates 40, 42, electrical connection can be made at the close distance from the electrode pads 28, 30; thus the connection distance can be shortened. Therefore, occurrence of voltage difference due to different connection distances of direct current resistance or voltage drop by direct current resistance can be reduced, and increased permissible current can be obtained in proportion to the reduction. In this case, the difference of the connection distance in the power system exists only in the length of the probes, and that difference is just about a difference in the depth length of the through holes 46, 48, so that the difference of resistance in the probes can be ignored, and voltage drop in the probes 34, 36 can be ignored as well.

Figure 6:
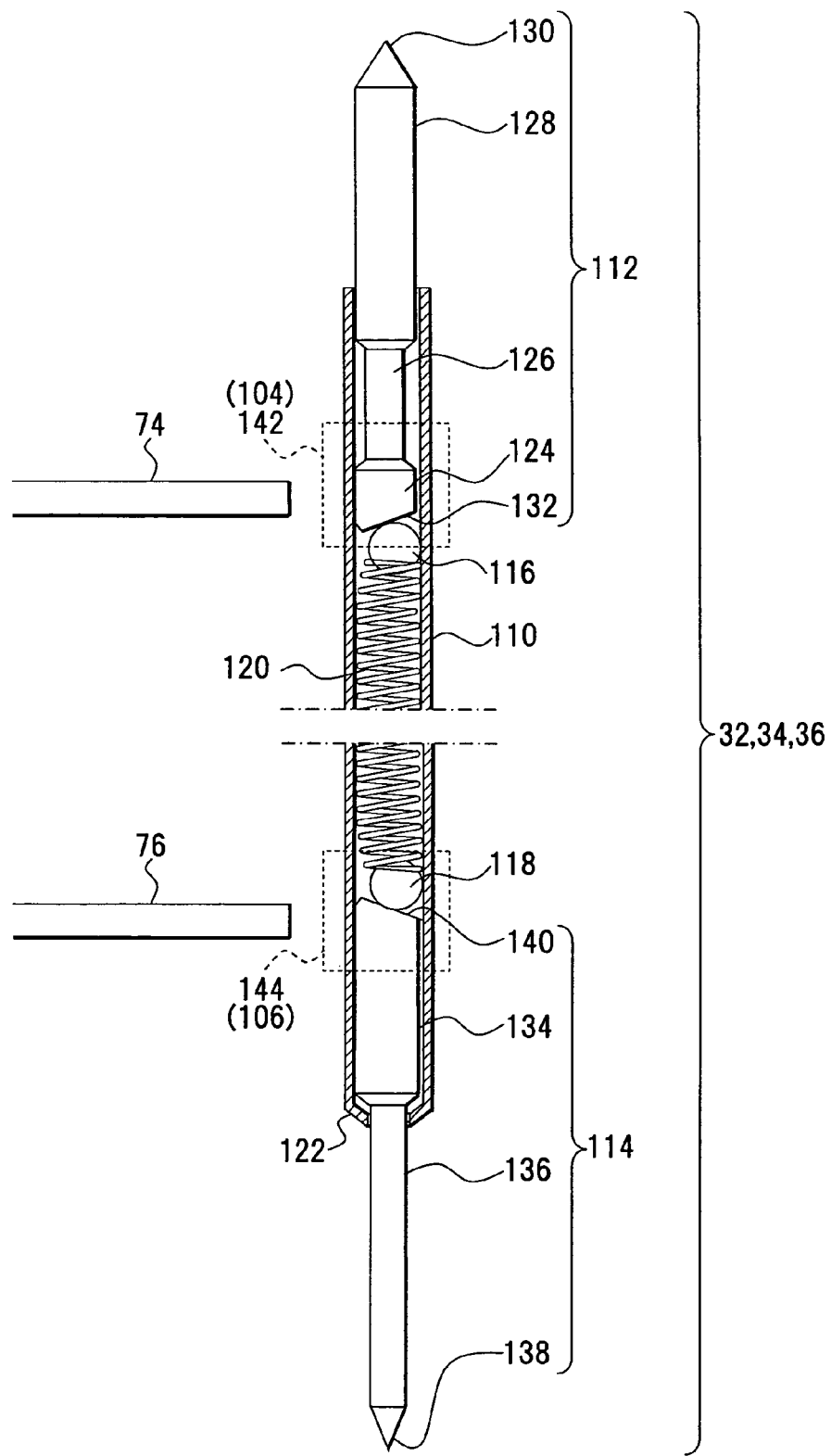
FIG. 6 is a diagram showing one example of a probe.
Figure 8A:
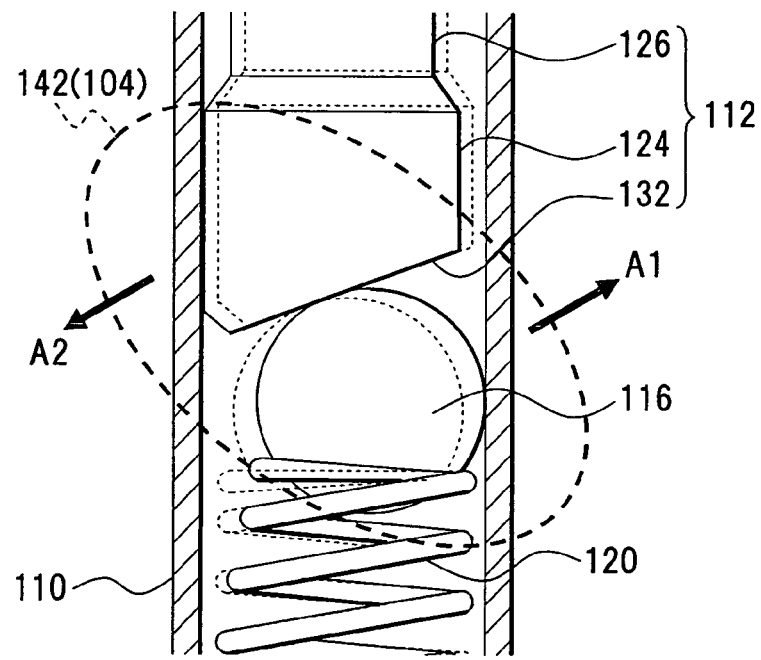
FIGS. 8A and 8B are diagrams showing heat-generating portions of a probe.
Figure 8B:
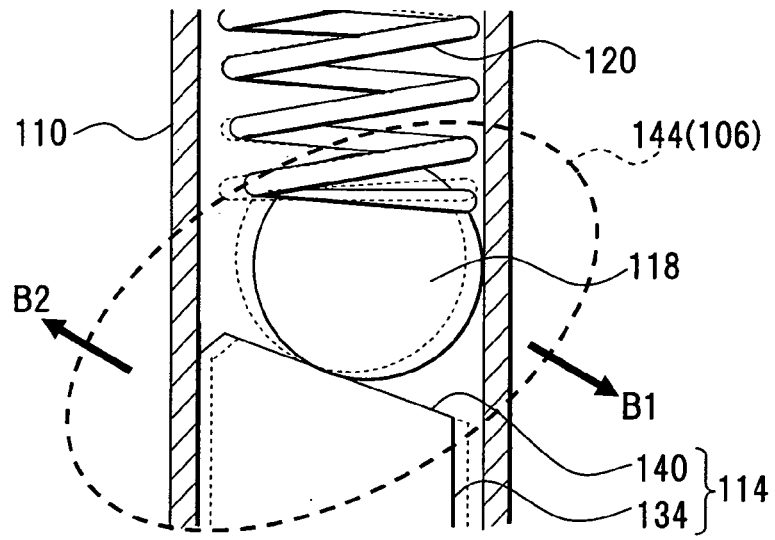
Figure 9:
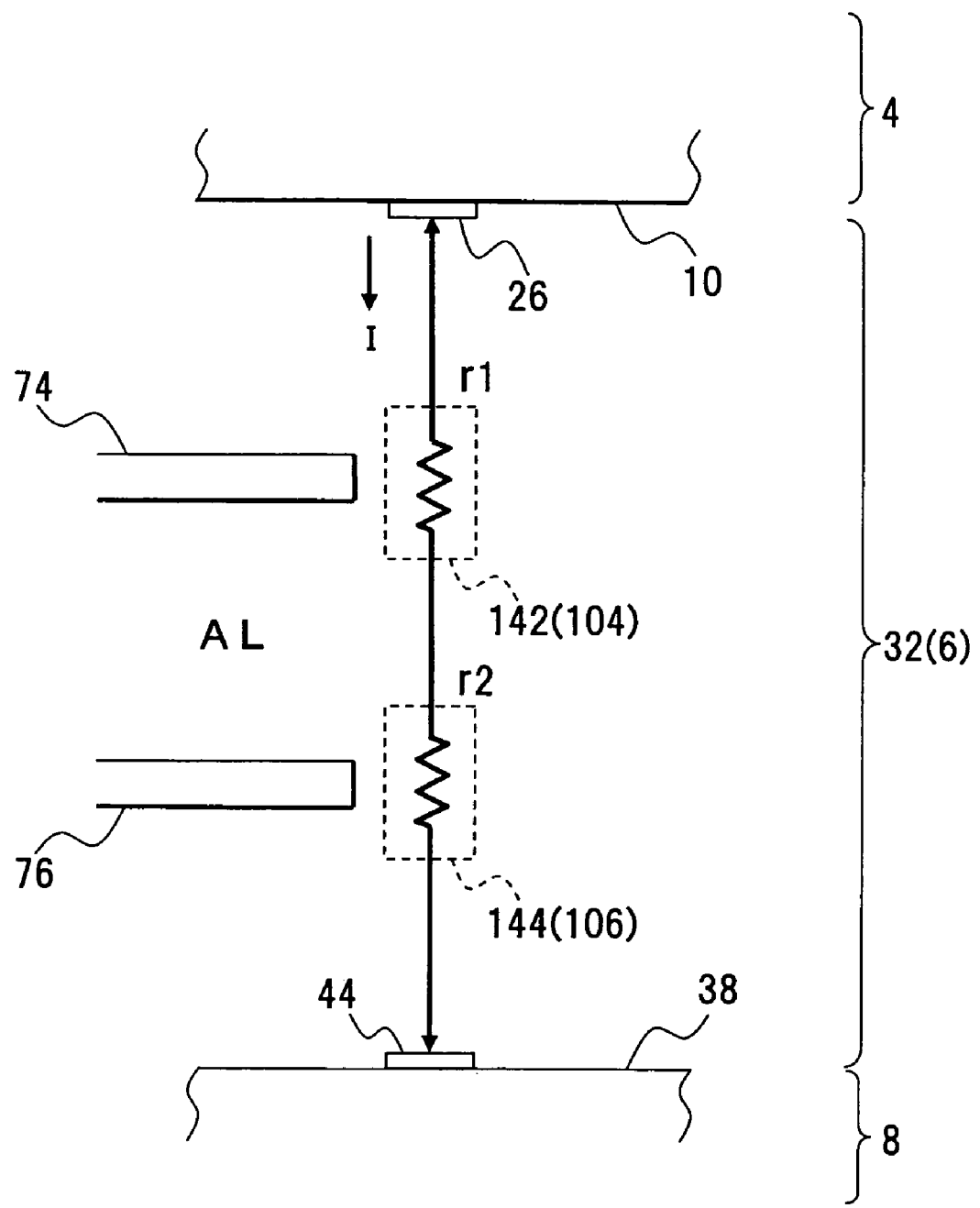
FIG. 9 is a diagram showing an equivalent circuit of a probe in signal system circuit.
Figure 10:
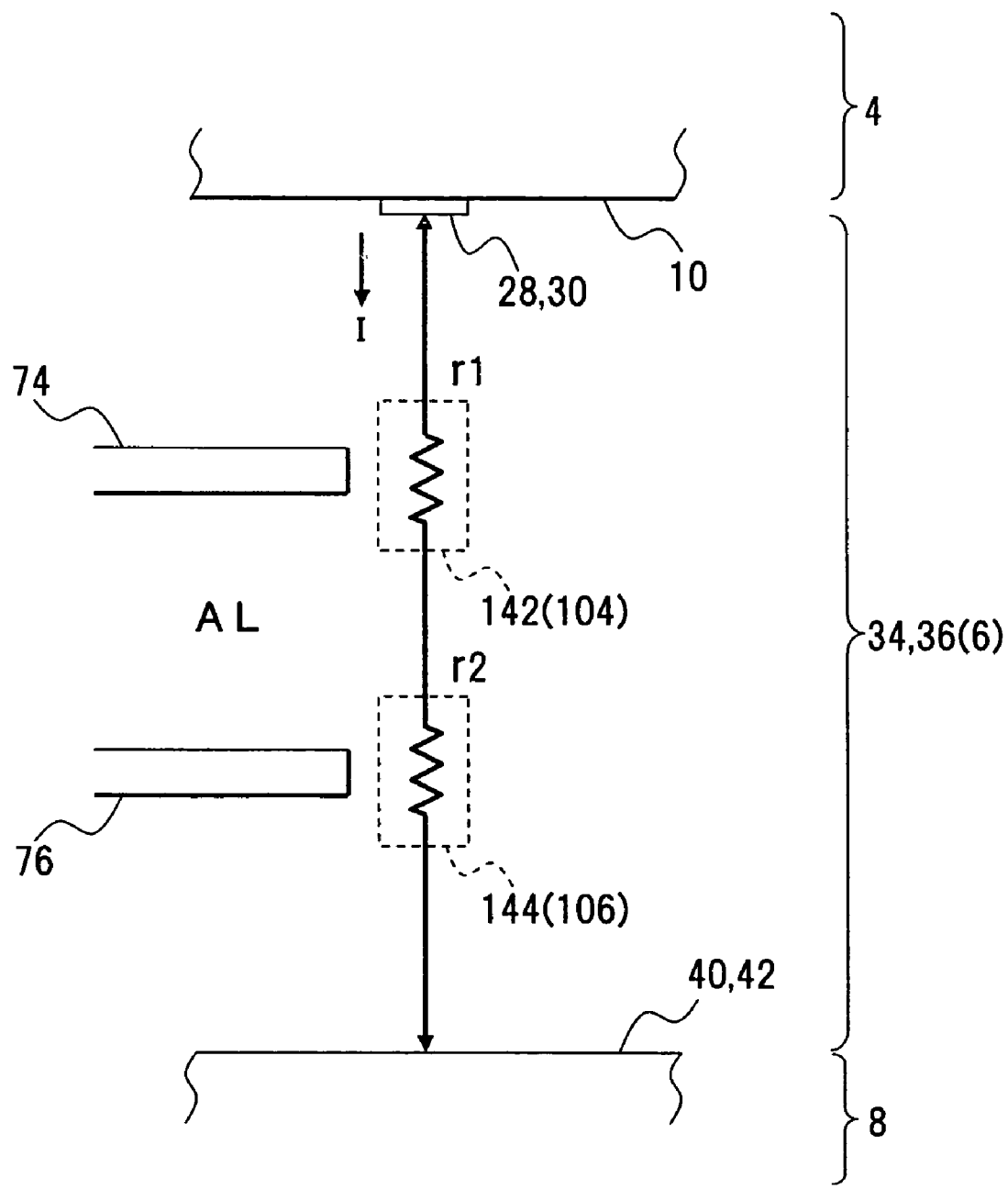
FIG. 10 is a diagram showing an equivalent circuit of a probe in power system circuit.

Next, structure and heat-generating portions of each probe 32, 34, 36 will be described with reference to FIGS. 6 to 10. FIG. 6 is a cross-sectional view of each probe 32, 34, 36; FIG. 7 is a diagram showing a compression state of probes; FIGS. 8A and 8B are diagrams showing heat-generating portions of each probe; and FIGS. 9 and 10 are diagrams showing an equivalent circuit of a probe. In FIG. 6 or 10, the same symbols are assigned to parts identical to those in FIGS. 1, 3, 4, and 5.

Each of the probes 32, 34, and 36 are comprised of a tube 110, movable plungers 112, 114, balls 116, 118, and an elastic component. The movable plungers 112, 114 constitute probe pins and in this embodiment, a spiral spring 120 is used as the elastic component. The tube 110 is shaped into a cylinder, for example, with the use of metallic materials having a good conductivity such as copper. In this embodiment, bottom end portion is narrowed to form a detachment prevention part 122. The upper movable plunger 112 is made of metallic materials having a good conductivity such as copper, similar to the tube 110, and consists of a larger-diameter bottom part 124, a smaller-diameter part 126 provided in the middle, a larger-diameter part 128 provided at the top side, and a pointing part 130. A slope 132 is formed at the bottom part 124, and a ball 116 is disposed between the slope 132 and the spring 120. Further, the lower movable plunger 114 is made of metallic materials having a good conductivity such as copper, similar to the movable plunger 112, and consists of a larger-diameter bottom part 134 as well as a smaller-diameter part 136 with a pointing part 138 formed at the smaller-diameter part 136 side. Similar to the movable plunger 112, a slope 140 is formed at the bottom part 134, and a ball 118 is disposed between the slope 140 and the spring 120.

In addition, by changing the length of the movable plunger 112 or 114, the probes 32, 34, 36 of different length are provided.

In such a configuration, for example, as shown in FIG. 7, if pressure (arrows F) is applied to the socket 6, then the movable plunger 112 is pressed to connect to the electrode pad 26, 28, or 30; and the movable plunger 114 is pressed to connect to the electrode pad 44, the conductive plate 40 or 42. With this, restoring force of the compressed spring 120 acts on the movable plunger 112 via the ball 116 and on the movable plunger 114 via the ball 118. When such force acts between the ball 116 and the slope 132, as shown in FIG. 8A, the ball 116 rolls along the slope 132 (arrow A1) the bottom part 124 of the movable plunger 112 is displaced in the direction opposite to the ball 116 (arrow A2); and the bottom part 124 and the ball 116 touch the inner wall of the tube 110. The reference numerical 142 indicates a contacting area. Similarly, when such force acts between the ball 118 and the slope 140, as shown in FIG. 8B, the ball 118 rolls along the slope 140 (arrow B1); the bottom part 134 of the movable plunger 114 is displaced in the direction opposite to the ball 118 (arrow B2); and the bottom part 134 and the ball 118 touch the inner wall of the tube 110. The reference numerical 144 indicates a contacting area.

At these contacting areas 142, 144, electrical conduction is achieved. Suppose that the contacting resistance at these contacting areas 142, 144 are r1, r2, then the electric path at the probe 32 side is shown as an equivalent circuit in FIG. 9, and the electric path at the probes 34, 36 side is shown as an equivalent circuit in FIG. 10.

Here, to make the explanation short, suppose that the current flowing through each of the probes 32, 34, 36 is I, and the power loss lost by the heat generation in the contacting areas 142, 144 are P1, P2, then the following equations are obtained.

$$P1 = I^2 * r1 \quad (1)$$

$$P2 = I^2 * r2 \quad (2)$$

The contacting areas 142, 144 producing these electricity losses P1, P2 become the above-described heat-generating portions 104, 106. Suppose that the electricity loss by each of the probes 32, 34, 36 is Pm, and the contacting resistance is rm, then the following equation is obtained.

$$Pm = P1 + P2 = I^2(r1+r2) = I^2 * rm \quad (3)$$

This means that the heat is generated by this electricity loss Pm by each of the probes 32, 34, 36. In FIG. 7, an arrow h indicates heat movement. This heat is dispersed into the air in the air layer AL as well as conveyed to the heatsink area 84 by being absorbed in the heatsink plates 74, 76. With this heatsinking, the resistance rm in the equation (3) is reduced so that the heat generation is suppressed and as a result, maximum permissible current can be secured.

Figure 11:
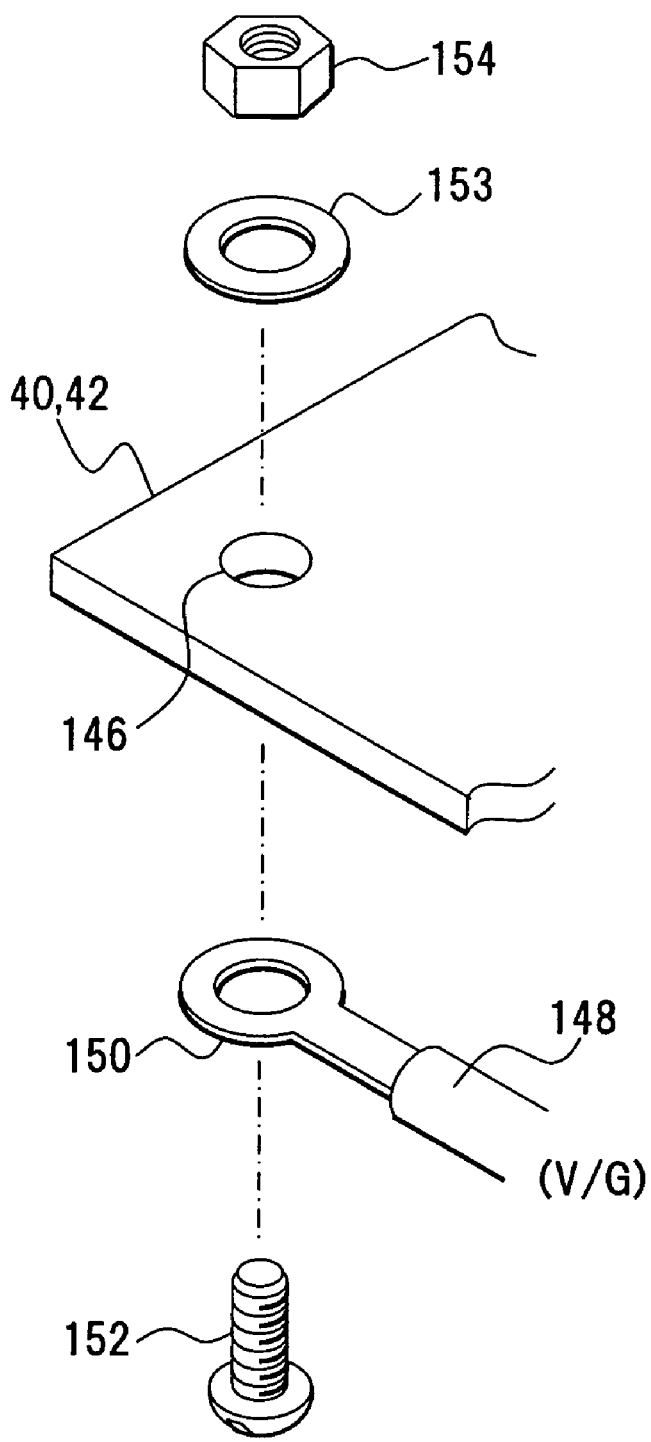
FIG. 11 is a diagram showing connection structure of power system to a conductive plate.

Next, connection of conductive plates 40, 42 of the socket board 8 to a power system will be described with reference to FIG. 11. FIG. 11 is a diagram showing a connection part of the power system to the conductive plates 40, 42.

A through hole 146 is formed in the conductive plates 40, 42, and by overlaying a ring-shaped connection part 150 of a lead 148 on this through hole 146 such that a screw 152 can penetrate therein, and by screwing a nut 154 firmly with the screw 152 after having overlaid a washer 153 on the conductive plates 40 and 42, the lead 148 can be attached to the conductive plates 40 and 42. The conductive plate 40 is grounded via the lead 148 and the conductive plate 42 is connected to the unshown power source via the lead 148.

Figure 12:
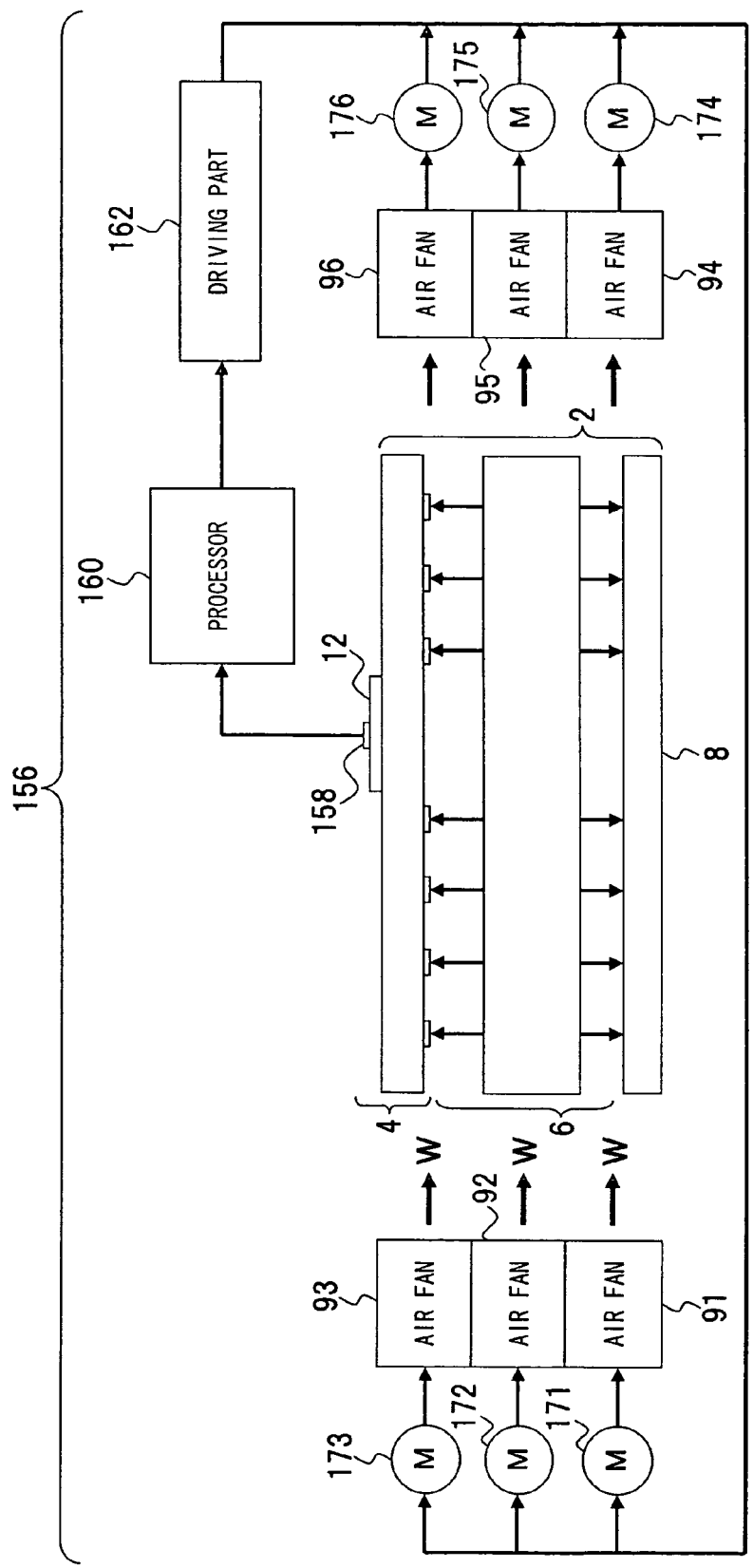
FIG. 12 is a diagram showing a rotation control device of air fans.

Next, control of the cooling air W will be described with reference to FIG. 12. FIG. 12 is a diagram showing a cooling control device of a socket and connection structure. In FIG. 12, the same symbols are assigned to parts identical to those in FIGS. 1 and 2.

In this cooling control device 156, a detected temperature is captured as a control information from a temperature sensor 158 mounted on the IC chip 12 embedded in the IC package 4 into a processor 160; the processor 160 applies a control output to a driving part 162 according to transition of the detected temperature; and controls the RPM (revolutions per minute) of each motor 171 to 176 in each air fan 91 to 96. That is, when the temperature of the IC package 4 rises, the RPM of each motor 171 to 176 is increased in response to the rise; and if cooling down proceeds, then the RPM is reduced. According to such a configuration, heatsinking or cooling down of the socket 6 is enhanced together with the IC package 4, which enables increase of permissible current.

Next, regarding the first embodiment, technical matters relating to securing of permissible current and reduction of voltage loss are extracted and technical meanings will be explained for each of the technical matters.

(1) Heat Movement by the Heatsink Plates 74, 76

Whenever current flows through each of the probes 32, 34, 36 for many hours, there is always a phenomenon of heat generation in the heat-generating portions 104, 106, and the temperature of the generated heat becomes higher as the current becomes larger. Such heat of the heat-generating portions 104, 106 can be absorbed in the heatsink plates 74, 76 penetrating each of the probes 32, 34, 36, and moved to outside the socket 6. And with this heat movement, the heat-generating portions 104, 106 in each of the probes 32, 34, 36 can disperse heat and get cooled down. With this cooling down, the heat generation of each of the probes 32, 34, 36 can be suppressed. Although permissible current has been restricted by heat resisting temperature, with such an improved heatsinking capability, along with the suppression of the heat generation, current capacity of permissible current in each socket 6 can be enhanced.

(2) Cooling Down by the Heatsink Slit 86 and by its Cooling Air W

The heat of each of the probes 32, 34, 36 is guided to the heatsink slit 86 via the heatsink plates 74, 76 and dispersed. The heatsink slit 86 is forcibly cooled down with the cooling air W produced by the rotation of the air fans 91, 92, 94, 95. That is, a temperature slant occurs between the heat-generating portions 104, 106 in the probes 32, 34, 36 and the heatsink slit 86 as a dummy heatsink fin by the medium of the heatsink plates 74, 76, and the heatsinking in the heat-generating portions 104, 106 are promoted by the cooling down of the heatsink slit 86.

(3) Suppression of Heat Accumulation by the air Layer AL

In the peripheral of each of the probes 32, 34, 36, the common air layer AL is formed by the space parts 80, 82 encompassing the heat-generating portions 104, 106; and through the contact of each of the heat-generating portions 104, 106 with the air, the heat is radiated and dispersed into the air layer AL. Further, since each of the probes 32, 34, 36 is disposed in the common air layer AL, temperature difference of probes among each of the probes 32, 34, 36 is reduced and temperature difference in the heat-generating portions 104, 106 per each of the probes 32, 34, 36 is reduced as well, so that a local heat accumulation as well as uneven distribution of the heat can be prevented. As a result, resistance component in each of the probes 32, 34, 36 dependent on temperature are ensured to become even.

Further, the heatsink plates 74, 76 are exposed in the air layer AL, so that the heat in the air layer AL can also be moved to the heatsink area 84 by the heatsink plates 74, 76, and this heat movement contributes to heatsink in the air layer AL.

(4) Reduction of Voltage Drop by the Probes 34, 36 and the Conductive Plates 40, 42

In regard to power supply in the IC package 4 having multi-pin structure, when a large current is supplied, a potential difference occurs between the probe assigned to the central portions and the probe assigned to the peripheral portions of the package. The reason of this occurrence is because peripheral resistance becomes small whereas inner resistance becomes large. Therefore, in this embodiment, as described above, a configuration is used in which the signal extraction board 38 constitutes the signal system, whereas the conductive plates 40, 42 constitutes the power system; the conductive plates 40, 42 are stacked on the signal extraction board 38; the probes 34, 36 are connected to the conductive plates 40, 42 at the nearest position of the power system in the IC package 4. Further, the probes 34, 36 are set to longer than the probe 32 in order to penetrate the signal extraction board 38; and the probe 36 is set to longer than the probe 34 in order to penetrate the signal extraction board 38 and the conductive plate 40. With this configuration, the potential difference between the central portions and the peripheral portions of the socket 6 can be reduced and each probe resistance is made to become even. Thus permissible current can be prevented from becoming uneven by different power supply points.

(5) Direct Cooling Down of the IC Package 4 and Indirect Cooling Down Thereof by Heatsinking in the Socket 6

Although the IC package 4 is cooled down by the heatsink 16 and the cooling air W from the air fans 93, 96; in addition to these direct cooling down, it can be expected that the IC package 4 is cooled down indirectly since the socket 6 is cooled down by the effects described in (1) to (3).

(6) Securing of Permissible Current

By the above-described cooling down of the socket 6 according to (1) to (4), temperature of each of the probes 32, 34, 36 can be controlled to become less than the heatproof temperature of parts in general (for example, about 70° C.) and temperature distribution can be maintained to become constant as well, so that loss of permissible current in the probe itself can be suppressed. Eventually maximum permissible current in the socket 6 and the electronic appliance 2 can be secured.

In this way, since maximum permissible current in the socket 6 and the electronic appliance 2 can be secured, the electronic appliance 2 having the socket 6 can be applied for a test of high heat generating packages or various devices requiring large current.

Second Embodiment

Figure 13:
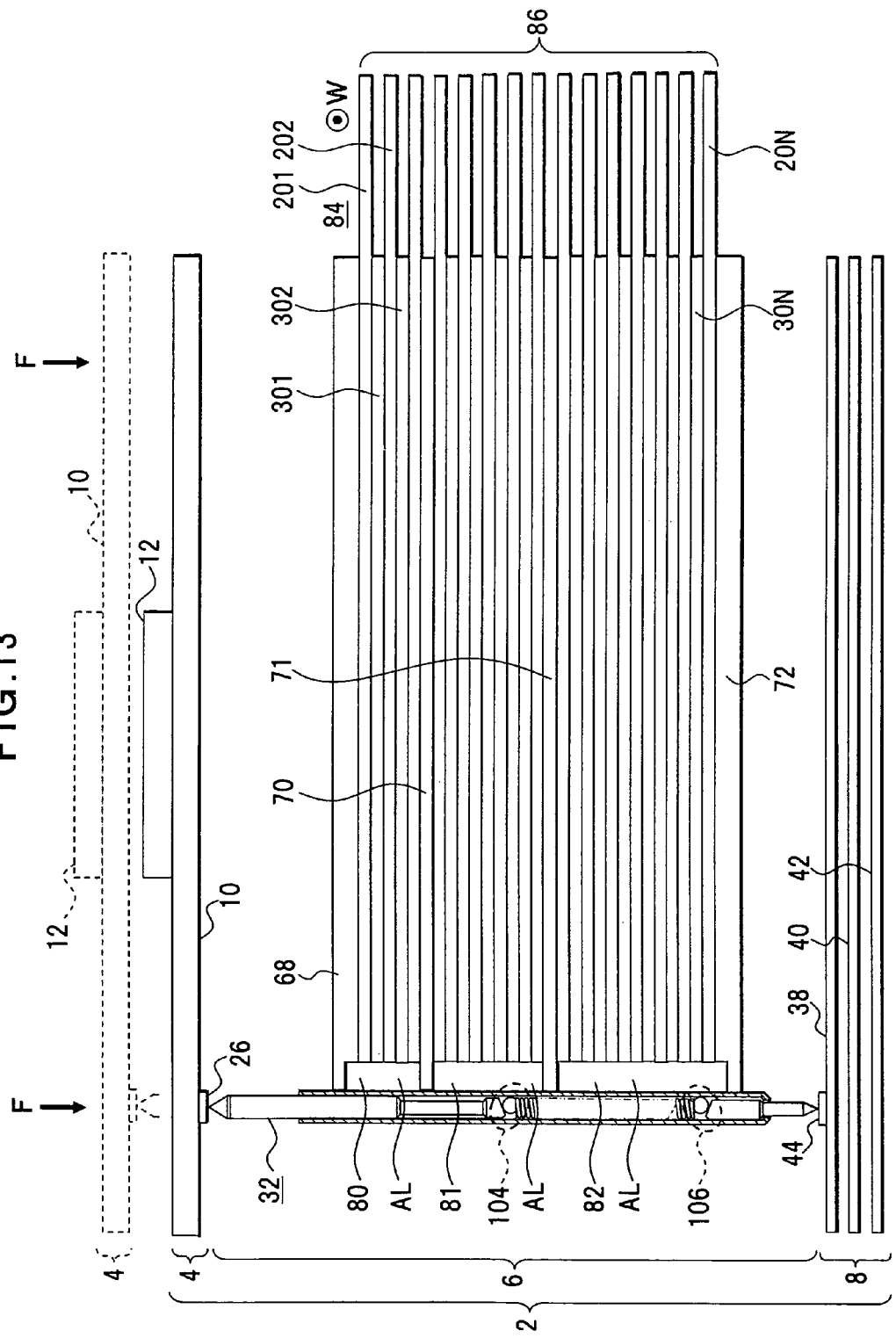
FIG. 13 is a diagram showing a socket and an electronic appliance according to a second embodiment.

Next, a second embodiment of the present invention will be described with reference to FIG. 13. FIG. 13 is a diagram showing connection structure of a socket and an electronic device according to a second embodiment. In FIG. 13, the same symbols are assigned to parts identical to those in FIGS. 1, 2, 3, 8A and 8B.

In the first embodiment (FIG. 2), three probe alignment plates 68, 70, 72 are used to align the probes 32, 34, 36; however, in this embodiment, four probe alignment plates 68, 70, 71, 72 are used to hold and align the probes 32, 34, 36, and there is also a laminated layer stacking alternately a plurality of heatsink plates 201, 202, . . . 20N as a heatsink component and spacers 301, 302, . . . 30N formed of insulating board in the space between these probe alignment plates 68, 70, 71, 72. At the front edge of these heatsink plates 201 to 20N and the spacers 301 to 30N, space parts 80, 81, 82 are formed, and as described above, the air layer AL is formed in these space parts 80, 81, 82. Further, the rear edge of each of the heatsink plates 201 to 20N is extended from the rear edge of the spacers 301 to 30N to be disposed at the heatsink area 84 and the heatsink slit 86 is formed thereat. To this heatsink slit 86, the cooling air W is supplied.

According to such a configuration, the heat of the heat-generating portions 104, 106 in the probes 32, 34, 36 can be received at the heatsink plates 201 to 20N facing the space parts 80, 81, 82 and then moved to the heatsink area 84. In this case, heatsinking from the heatsink slit 86 is promoted with the cooling air W and the heat-generating portions 104, 106 are cooled down via heatsink plates 201 to 20N. Further, the space parts 80, 81, 82 are formed to encompass the heat-generating portions 104, 106 in the probes 32, 34, 36 so that the heat in the heat-generating portions 104, 106 can be dispersed into the internal air layer AL, which reduces heat density thereof and thus a local overheat can be prevented.

In this embodiment, although the distance between the probes 32, 34, 36 and the heatsink plates 201 to 20N that are a heatsink component is set to be equal, this distance can be differentiated in response to the distance from the heat-generating portions 104, 106. According to such a configuration, without narrowing the capacity of the space parts 81, 82, 83, the heat in the heat-generating portions 104, 106 can be effectively guided to the heatsink area 84 via the heatsink plates 201 to 20N, and thus the heat-generating portions 104, 106 in the probes 32, 34, 36 can be cooled down.

Third Embodiment

Figure 14:
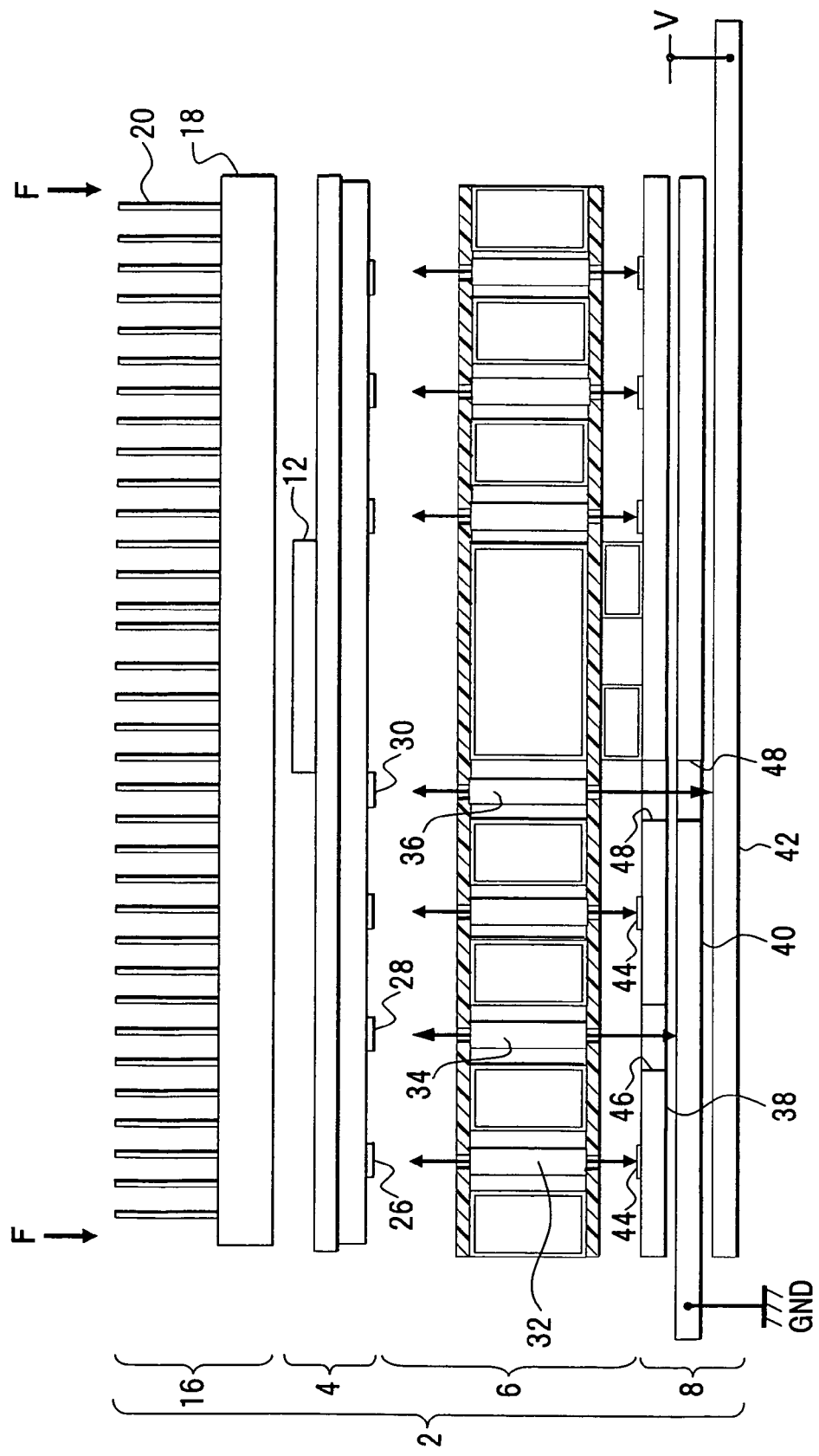
FIG. 14 is a diagram showing a socket and an electronic appliance according to a third embodiment.

Next, a third embodiment of the present invention will be described with reference to FIG. 14. FIG. 14 is a diagram showing connection structure of a socket and an electronic appliance according to a third embodiment. In FIG. 14, the same symbols are assigned to parts identical to those in FIGS. 1, 2, and 3.

In the first and the second embodiments, in order to move the heat in the probes 32, 34, 36, the heatsink plates 74, 76, 201 to 20N are disposed and the socket 6 in which the space parts 80, 82 are formed in the peripheral portions of the probes 32, 34, 36 is used. However, the socket 6 does not have to be limited to such a configuration, and as shown in FIG. 14, a coaxial structure can also be used.

In addition, the signal system circuit and the power system circuit can be configured independently, by differentiating the length of these probes 32, 34, 36 such that the probe 32 corresponds to the signal extraction board 38 of the socket board 8 and the IC package 4; the probe 34 corresponds to the conductive plate 40 of the socket board 8 and the IC package 4; and the probe 36 corresponds to the conductive plate 42 of the socket board 8 and the IC package 4.

According to such a configuration, connection distance of the power system circuit can be shortened, which reduces a potential difference and voltage drop, and as a result, permissible current can be enhanced.

Fourth Embodiment

Figure 15:
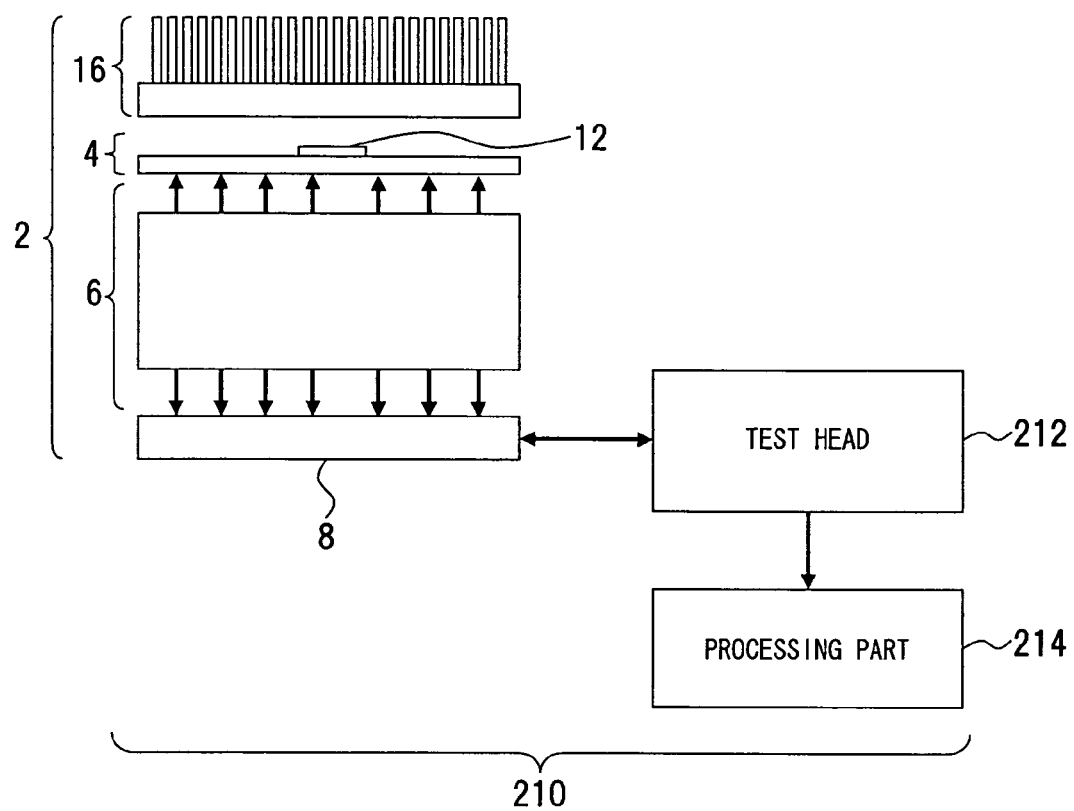
FIG. 15 is a diagram showing an IC test device according to a fourth embodiment.

Next, a fourth embodiment of the present invention will be described with reference to FIG. 15. FIG. 15 is a diagram showing a test device of an electronic device according to a fourth embodiment. In FIG. 15, the same symbols are assigned to parts identical to those in FIGS. 1, 2, and 3.

This IC test device 210 consists of an electronic appliance 2 including the above-described socket 6, a test head 212, and a processing part 214 including a mainframe and the like. The electronic appliance 2 has the same configuration as described above, and mounts the IC package 4 as a test subject. The test head 212 includes drivers and the like. Further, the processing part 214 includes various types of generators and format controllers and others.

Being configured as such, heatsinking capability of the electronic appliance 2 and its permissible current are enhanced, so that a test of high heat generating package is enabled and an IC test passing a large current can be performed.

Fifth Embodiment

Figure 16:
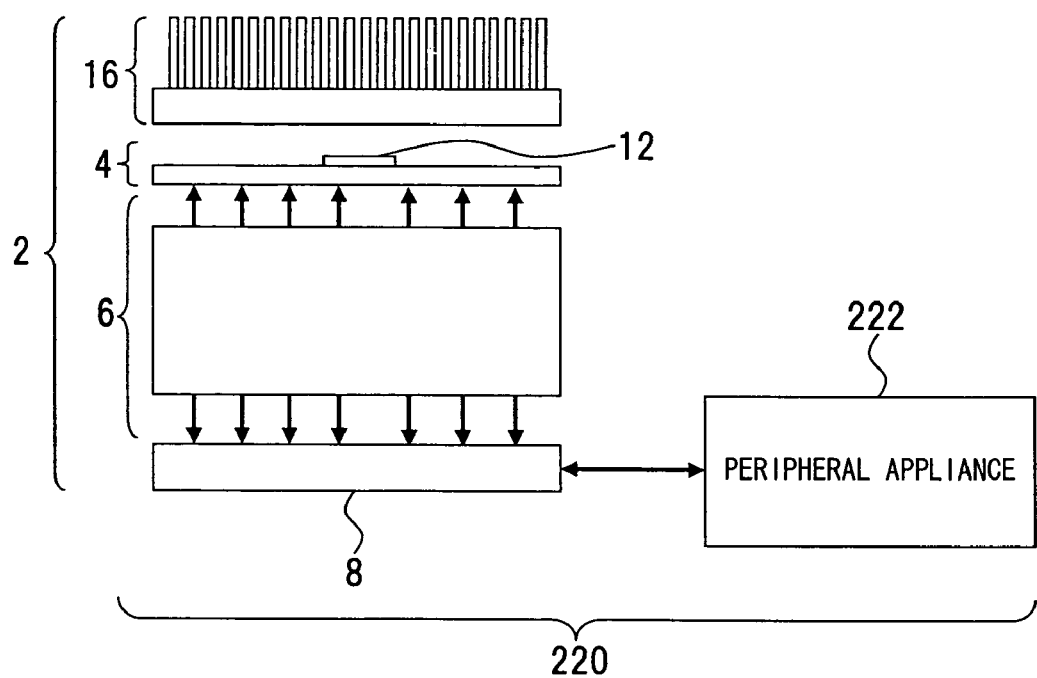
FIG. 16 is a diagram showing a PC according to a fifth embodiment.

Next, a fifth embodiment of the present invention will be described with reference to FIG. 16. FIG. 16 is a diagram showing a PC (personal computer) according to a fifth embodiment. In FIG. 16, the same symbols are assigned to parts identical to those in FIGS. 1, 2, and 3.

This PC 220 includes the electronic appliance 2, and a peripheral appliance 222 is connected thereto via the IC package 4 and the above-described socket 6 and the like. The electronic appliance 2 has the same configuration as described above. Being configured as such, heatsinking capability of the electronic appliance 2 and its permissible current are enhanced, so that the PC 220 is comprised as an electronic appliance capable of passing a large current.

Figure 17:
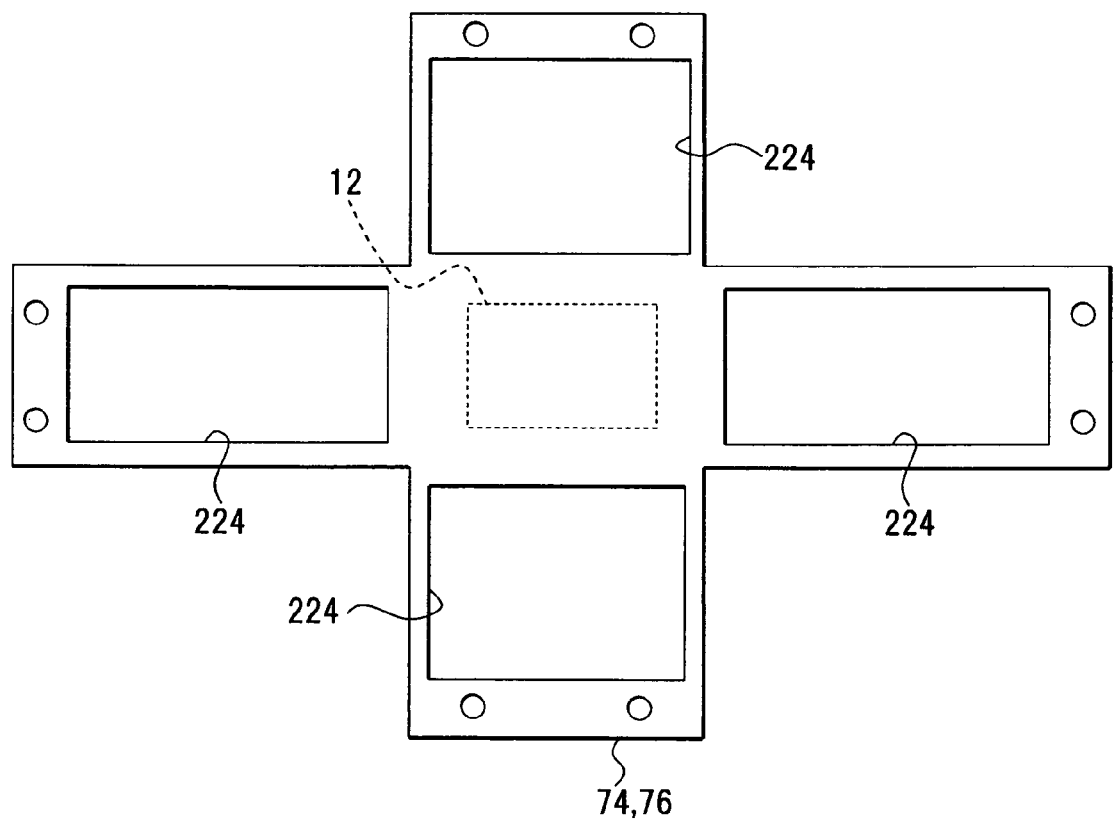
FIG. 17 is a diagram showing a heatsink plate according to other embodiments.

Other Embodiments (1) An example of a heatsink plate in a different form will be described with reference to FIG. 17. FIG. 17 is a diagram of a heatsink plate in a different form. In FIG. 17, the same symbols are assigned to parts identical to those in FIGS. 2 and 3. In this case, in the heatsink plates 74, 76, through holes 224 are formed in order to reduce temperature variation between the layers when they are laminated, and the bottom surface of the IC chip 12 may be shaped to be flat in order to enhance its heatsink function. Further, in each of the through holes 224, the unshown probes 32, 34, 36 (FIG. 2) are disposed.

(2) An example of a heatsink in a different form will be described with reference to FIG. 18. FIG. 18 is a diagram showing an electronic appliance using a different heatsink. In FIG. 18, the same symbols are assigned to parts identical to those in FIG. 1.

In this case, in the heat charge plate 18 of the heatsink 16, through holes 226 are formed in every direction in order to penetrate the opening portion 24 and the outer wall. Further, a compressed air PA is supplied to a nozzle 230 via a flow regulator valve 228, and the jet orifice of this nozzle 230 faces towards the opening portion 24. When a blast of the compressed air PA is sent to the opening portion 24, the flow regulator valve 228 adjusts its supplying amount. The compressed air PA passes the opening portion 24 to exit from the through holes 226. With this, the heat charge plate 18 is cooled down.

(3) In the above-described embodiment, a spring probe is exemplified as the probes 32, 34, 36. However, the present invention can be applied to probes of any forms as long as heat is generated therein, and is not limited to the probes in the above-described embodiments.

A most preferred embodiment and the like of the present invention have been described above. However, the present invention is not limited to the above description; it goes without saying that various modifications and alterations may be made by a person skilled in the art on the basis of the gist of the invention that is described in the claims and disclosed in the detailed description of the invention, and that such modifications and alterations are included in the scope of the present invention.

The present invention is used for connection of an electronic device such as an IC package having multi-pin structure, and with its capability of suppressing heat generation and of securing maximum permissible current, can be used for a test of an IC package of high heat generation or an electronic appliance passing a large current therein.

What is claimed is:

1. A socket connected to an electronic device, the socket comprising:
    a probe to be connected with the electronic device; a plurality of heatsink plates adjacent to a local heat-generating portion distributed unevenly in the probe, the heatsink plates comprising a through hole communicating with an air layer, wherein the air layer lies between the heatsink plates and the heat-generating portion in the probe, so that the heatsink plates move heat absorbed from the heat-generation portion in the probe via the air layer to a heatsink area by heat conduction, wherein
    the plurality of heatsink plates are stacked in layers and disposed to form a slit, wherein cooling air is supplied to the slit in a plane direction of the heatsink plates;
    a plurality of probe alignment plates penetrated by the probes and aligning the probes; and
    a plurality of spacers formed of an insulating board,
    wherein a laminated layer stacking alternately the heatsink plates and the spacers is formed in a space between the probe alignment plates.

2. The socket of claim 1, wherein the heat-generating portion of the probe is encompassed by the air layer.

3. The socket of claim 1, wherein the heatsink plates are extended to the side of the socket such that their end portions form heatsink fins.

4. The socket of claim 1, further comprising:
    a first probe to be connected with pressure between an electrode of signal system in the electronic device and an electrode of signal extraction board corresponding to the signal system; and
    a second probe to be connected with pressure between an electrode of power system in the electronic device and an electric conductor corresponding to the power system.

5. The socket of claim 1, wherein the heatsink area is cooled down by air or water.

6. The socket of claim 1, wherein the electronic device is an IC package.

7. The socket of claim 1, wherein the probe is comprised of a tube and a plunger supported by the tube.

8. The socket of claim 1, further comprising a space part formed in a holding component that holds the probe such that the space part constitutes an air layer.

9. The socket of claim 1, wherein the heatsink plates further comprise a space part such that the space part constitutes an air layer.

10. An electronic appliance connected to an electronic device, the electronic appliance comprising:
    a socket to be connected with the electronic device;
    an air fan that supplies cooling air to the socket, wherein the socket further comprises a probe; and
    a plurality of heatsink plates adjacent to a local heat-generating portion distributed unevenly in the probe, wherein the heatsink plates comprises a through hole communicating with an air layer, and the air layer lies between the heatsink plates and the heat-generating portion in the probe, so that the heatsink plates move heat absorbed from the heat-generation portion in the probe via the air layer to a heatsink area by heat conduction,
    wherein the plurality of heatsink plates are stacked in layers and disposed to form a slit, and the air fan supplies cooling air to the slit in a plane direction of the heatsink plates, the socket comprising a plurality of the probe alignment plates penetrated by the probes and aligning the probes; and a plurality of spacers formed of an insulating board, wherein a laminated layer stacking alternately the heatsink plates and the spacers is formed in a space between the probe alignment plates.

11. The electronic appliance of claim 10, wherein the heat-generating portion of the probe is encompassed by the air layer.

12. The electronic appliance of claim 10, wherein the heatsink plates are extended to the side of the socket such that their end portions form heatsink fins.

13. The electronic appliance of claim 10, further comprising:

a first probe to be connected with pressure between an electrode of signal system in the electronic device and an electrode of signal extraction board corresponding to the signal system; and a second probe to be connected with pressure between an electrode of power system in the electronic device and an electric conductor corresponding to the power system.

14. The electronic appliance of claim 10, wherein the heatsink area is cooled down by air or water.

15. The electronic appliance of claim 10, wherein the electronic device is an IC package.

16. The electronic appliance of claim 10, wherein the probe is comprised of a tube and a plunger supported by the tube.

17. The electronic appliance of claim 10, further comprising a space part formed in a holding component that holds the probe such that the space part constitutes an air layer.

18. An electronic appliance connected to an electronic device, the electronic appliance comprising:

a socket to be connected with the electronic device;

a signal extraction board corresponding to a signal system in the electronic device;

an electric conductor plate corresponding to power system in the electronic device;

a first probe disposed in the socket and connected with pressure between an electrode of the signal system in the electronic device and an electrode of the signal extraction board; and a second probe disposed in the socket and connected with pressure between an electrode of the power system in the electronic device and the electric conductor plate corresponding to the power system, the electric conductor plate being exposed by a through hole formed at a position opposing the electrode of the power system, the socket comprising a probe holder and preventing detachment of the first probe and the second probe from the socket;

a plurality of heatsink plates adjacent to a local heat-generating portion distributed unevenly in the first probe and/or the second probe;

a plurality of probe alignment plates penetrated by the first probe and the second probe, and aligning the first probe and the second probe; and a plurality of spacers formed of an insulating board, wherein the second probe extends through the signal extraction board to reach the electric conductor plate, wherein the second probe is longer than the first probe, wherein the plurality of heatsink plates are stacked in layers and disposed to form a slit, and cooling air is supplied to the slit in a plane direction of the heatsink plates, and wherein a laminated layer stacking alternately the heatsink plates and the spacers is formed in a space between the probe alignment plates.

19. The electronic appliance of claim 18, further comprising an air fan to supply cooling air to the sidewall of the socket.

20. The electronic appliance of claim 18, further comprising an air fan to supply cooling air to the sidewall of the socket, wherein the revolutions per minute of the air fan is controlled by using a temperature detected by a temperature sensor mounted on an IC package as a control information.

* * * * *